United States Patent
Kim et al.

(10) Patent No.: US 10,211,372 B1
(45) Date of Patent: Feb. 19, 2019

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jin Hwan Kim, Seoul (KR); Sung Joon Kim, Yongin-si (KR); Su Hyun Jo, Hwaseong-si (KR); Seung Hwan Lee, Suwon-si (KR); Tae Sung Jang, Hwaseong-si (KR)

(73) Assignee: SAMSUNG ELECTRONICS CO., LTD., Suwon-Si, Gyeonngi-Do (KR)

( * ) Notice: Subject to any disclaimer, the term of this patent is extended or adjusted under 35 U.S.C. 154(b) by 0 days.

(21) Appl. No.: 15/939,909

(22) Filed: Mar. 29, 2018

(30) Foreign Application Priority Data

Sep. 29, 2017 (KR) .................. 10-2017-0127984

(51) Int. Cl.
| | |
|---|---|
| *H01L 21/78* | (2006.01) |
| *H01L 33/38* | (2010.01) |
| *H01L 27/15* | (2006.01) |
| *H01L 33/44* | (2010.01) |
| *H01L 23/544* | (2006.01) |
| *H01L 21/784* | (2006.01) |
| *H01L 21/782* | (2006.01) |

(52) U.S. Cl.
CPC .............. *H01L 33/38* (2013.01); *H01L 21/78* (2013.01); *H01L 21/782* (2013.01); *H01L 21/784* (2013.01); *H01L 21/7806* (2013.01); *H01L 23/544* (2013.01); *H01L 27/156* (2013.01); *H01L 33/385* (2013.01); *H01L 33/44* (2013.01); *H01L 2223/54426* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

| | | |
|---|---|---|
| KR | 10-2014-0049275 A | 4/2014 |
| KR | 10-2015-0077160 A | 7/2015 |
| KR | 10-1564342 B1 | 10/2015 |

*Primary Examiner* — Minh-Loan Tran
(74) *Attorney, Agent, or Firm* — Lee & Morse, P.C.

(57) ABSTRACT

A semiconductor light emitting device includes a light emitting structure including a first conductivity-type semiconductor layer, an active layer, and a second conductivity-type semiconductor layer, sequentially stacked on a substrate along a first direction, and including an exposed region exposing the first conductivity-type semiconductor layer. A first contact electrode is in the exposed region, a second contact electrode is on the second conductivity-type semiconductor layer, and an insulating layer covers the light emitting structure. Separate electrode pads penetrate the insulating layer to be electrically connected to the first contact electrode and the second contact electrode. A side surface of at least one of the first and second electrode pads may extend to be coplanar with a side surface of the substrate along the first direction.

20 Claims, 22 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,348,601 B2 | 3/2008 | Hata |
| 7,439,551 B2 | 10/2008 | Hata |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,362,498 B2 | 1/2013 | Jeong |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2010/0078656 A1* | 4/2010 | Seo ................ H01L 27/156 |
| | | 257/88 |
| 2011/0284880 A1 | 11/2011 | Jeong |
| 2015/0333228 A1* | 11/2015 | Song ................ H01L 33/38 |
| | | 257/99 |
| 2016/0118564 A1* | 4/2016 | Kim ................ H01L 33/20 |
| | | 257/99 |

* cited by examiner

I-I'

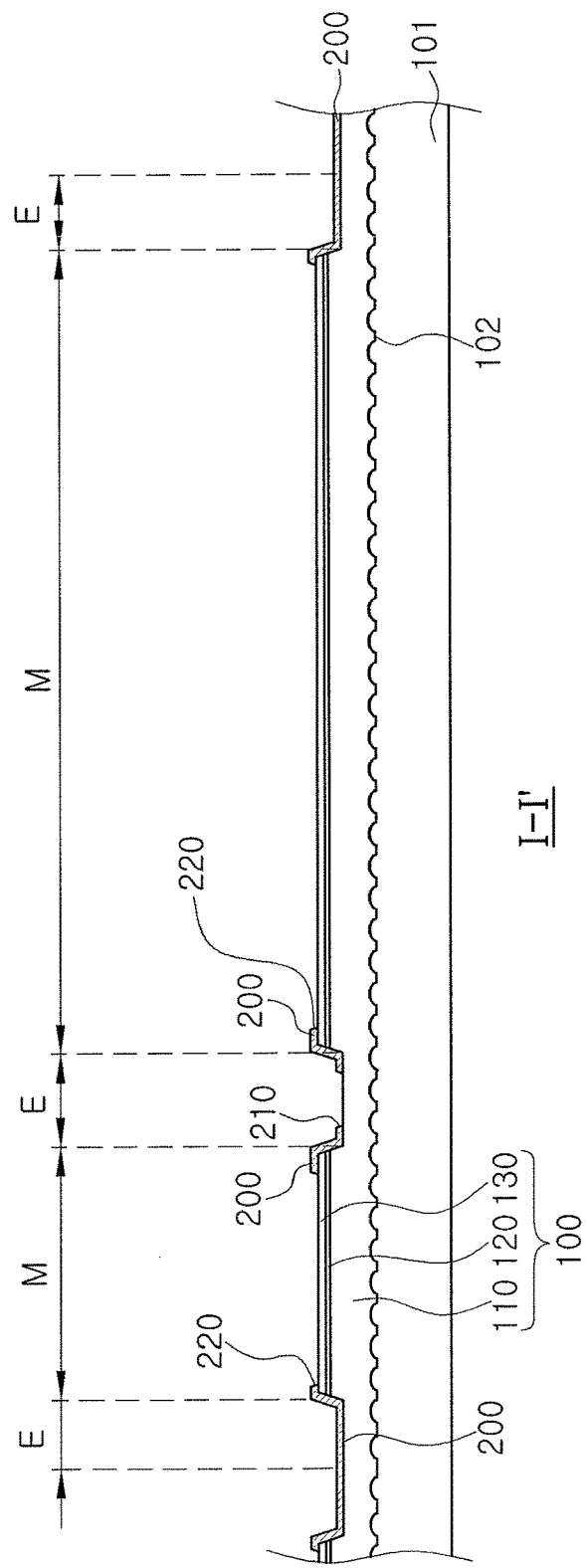

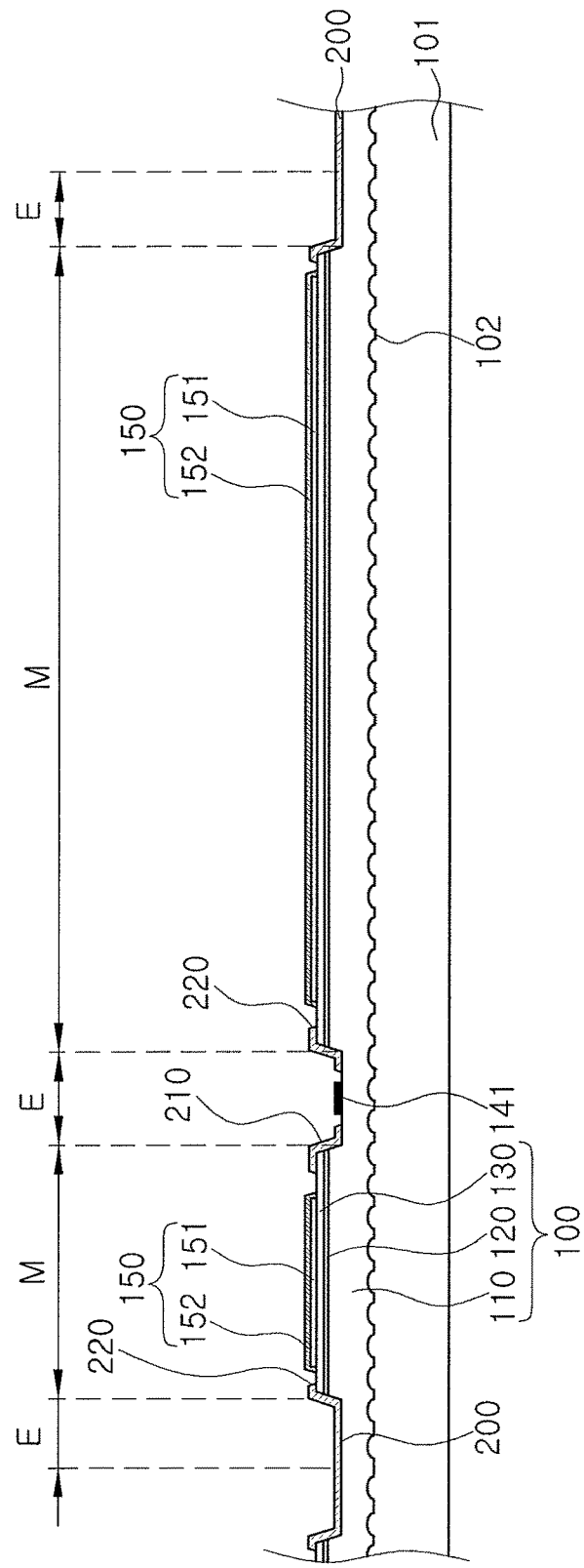

I-I'

I-I'

SEMICONDUCTOR LIGHT EMITTING DEVICE

CROSS-REFERENCE TO RELATED APPLICATION

Korean Patent Application No. 10-2017-0127984, filed on Sep. 29, 2017, with the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Semiconductor light emitting devices emit light using the principle of the recombination of electrons and holes when an electric current is applied thereto. Due to various advantages thereof, such as low power consumption, high luminance, ease of miniaturization, and the like, semiconductor light emitting devices are widely used as light sources. In particular, since the development of nitride-based light emitting devices, the range of use thereof has been further extended, and have been employed in light source modules, domestic lighting devices, automotive lighting devices, and the like.

In addition, as the range of use of semiconductor light emitting devices has been expanded, semiconductor light emitting devices have gradually been applied to light source devices having a high level of electric current and power. As a result, research into methods of improving the external light extraction efficiency of semiconductor light emitting device packages has been undertaken.

SUMMARY

According to an embodiment, a semiconductor light emitting device includes a light emitting structure including a first conductivity-type semiconductor layer, an active layer, and a second conductivity-type semiconductor layer, sequentially stacked on a substrate along a first direction, and including an exposed region in which the substrate is exposed, a first contact electrode in the exposed region in which the second conductivity-type semiconductor layer and the active layer are partially removed, a second contact electrode disposed on the second conductivity-type semiconductor layer, an insulating layer covering the light emitting structure, a first electrode pad penetrating through the insulating layer to be electrically connected to the first contact electrode, at least a region of the first electrode pad being disposed on the second contact electrode, and a second electrode pad penetrating through the insulating layer to be electrically connected to the second contact electrode. At least one of a side surface of the first electrode pad and a side surface of the second electrode pad is extended to be coplanar with a side surface of the substrate.

According to an embodiment, a semiconductor light emitting device includes a light emitting structure on a substrate and including a first conductivity-type semiconductor layer having an upper surface divided into a first region and a second region, an active layer and a second conductivity-type semiconductor layer, sequentially stacked on the second region of the first conductivity-type semiconductor layer along a first direction, a first contact electrode on the first region of the first conductivity-type semiconductor layer, a second contact electrode on the second conductivity-type semiconductor layer, an insulating layer covering the light emitting structure, a first electrode pad penetrating through the insulating layer to be electrically connected to the first contact electrode, at least a region of the first electrode pad being disposed on the second contact electrode, a second electrode pad penetrating through the insulating layer to be electrically connected to the second contact electrode, a passivation layer covering the first electrode pad and the second electrode pad, and a first solder pad and a second solder pad, penetrating through the passivation layer and electrically connected to the first electrode pad and the second electrode pad, respectively. At least one of the first electrode pad and the second electrode pad extends to each side of the substrate.

According to an embodiment, a semiconductor light emitting device includes a plurality of light emitting structures including a first conductivity-type semiconductor layer, an active layer, and a second conductivity-type semiconductor layer, sequentially stacked on a substrate and including an exposed region in which the first conductivity-type semiconductor layer is exposed, at least one first electrode pad commonly connected to the first conductivity-type semiconductor layer of the plurality of light emitting structures, and a plurality of second electrode pads connected to the second conductivity-type semiconductor layer of the plurality of light emitting structures, respectively. At least one of the at least one first electrode pad and the plurality of second electrode pads may be on a device separation region separating the plurality of light emitting structures into individual semiconductor light emitting devices.

BRIEF DESCRIPTION OF DRAWINGS

Features will become apparent to those of skill in the art by describing in detail exemplary embodiments with reference to the attached drawings in which:

FIGS. 7A to 14A illustrate top views of stages in a process of manufacturing a semiconductor light emitting device of FIG. 2; and FIGS. 7B to 14B illustrate side cross-sectional views of stages in a process of manufacturing a semiconductor light emitting device of FIG. 2, wherein "A" figures denote top views and "B" figures denote cross-sectional views of the corresponding top views.

DETAILED DESCRIPTION

Hereinafter, embodiments will be described with reference to the attached drawings.

Figure 1:
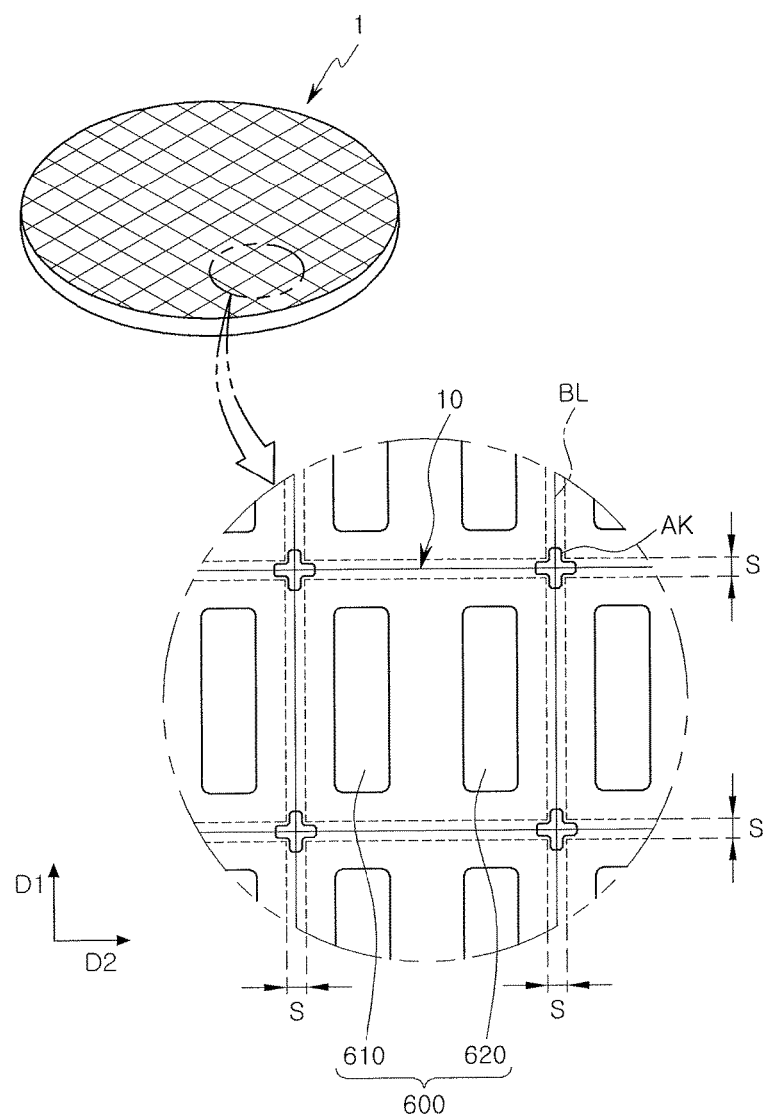
FIG. 1 illustrates a schematic perspective view of a semiconductor wafer in which a semiconductor light emitting device is disposed according to an example embodiment.
Figure 2:
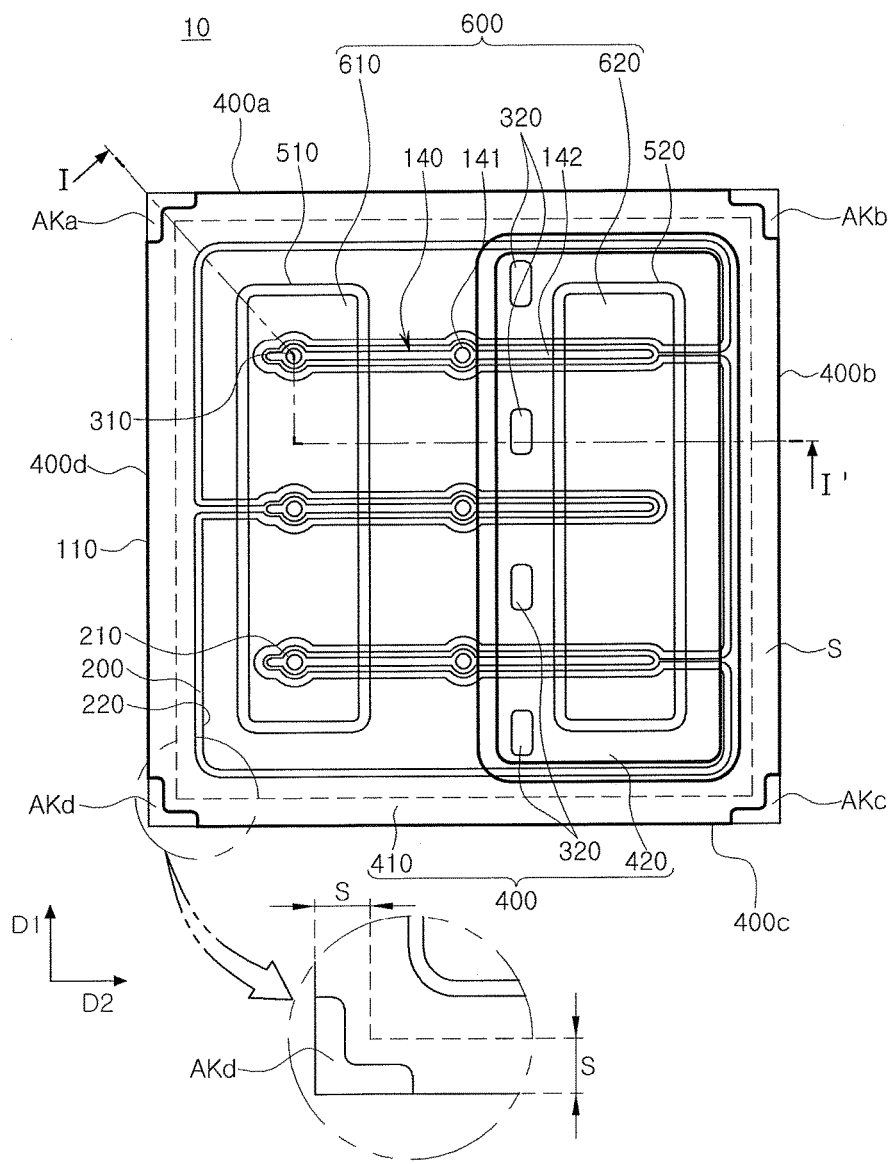
FIG. 2 illustrates an enlarged top view of a single semiconductor light emitting device of FIG. 1.
Figure 3:
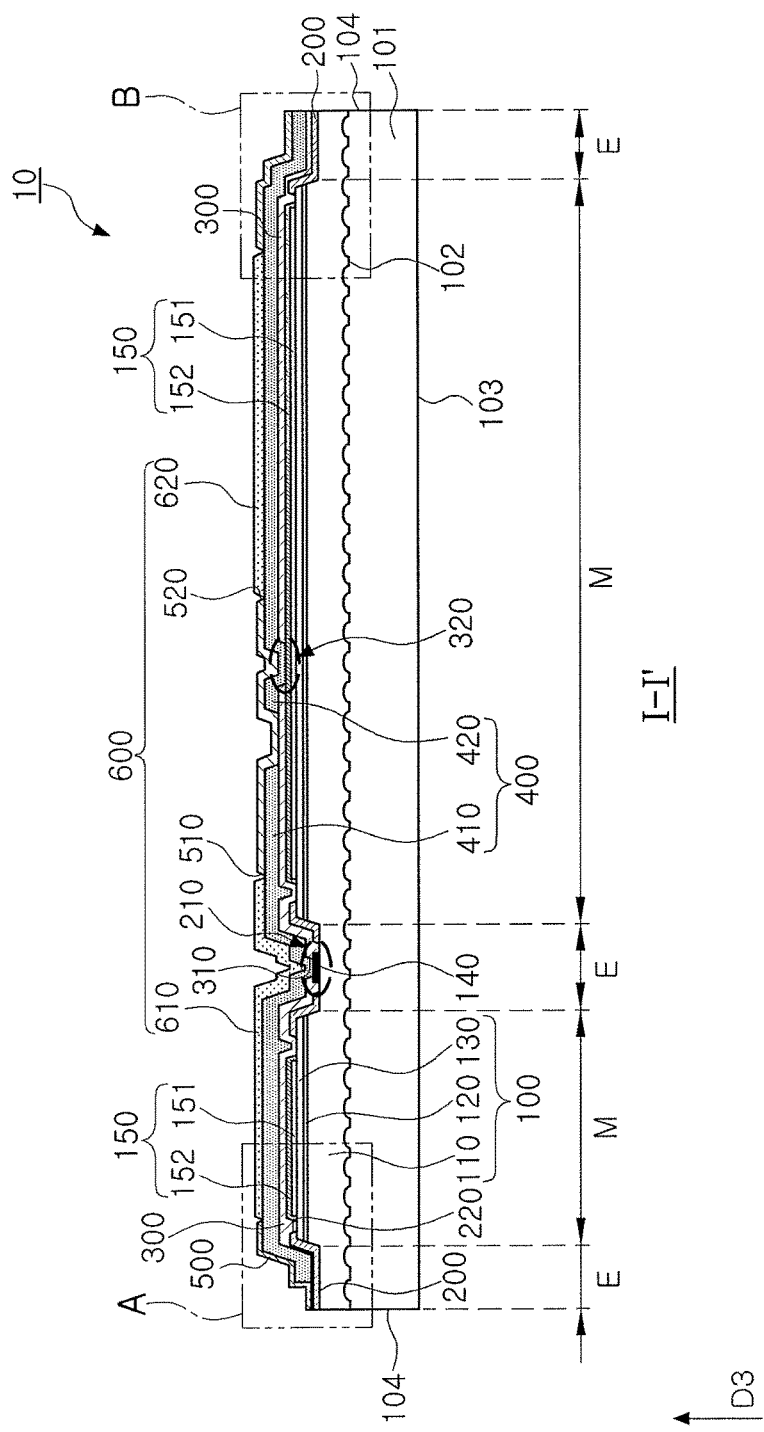
FIG. 3 illustrates a side cross-sectional view taken along line I-I' of FIG. 2.

With reference to FIGS. 1 to 4, a semiconductor light emitting device according to an example embodiment will be described. FIG. 1 is a schematic perspective view of a semiconductor wafer in which a semiconductor light emitting device is disposed according to an example embodiment, while FIG. 2 is an enlarged top view of a single semiconductor light emitting device of FIG. 1. FIG. 3 is a side cross-sectional view taken along line I-I' of FIG. 2. FIGS. 4A and 4B are enlarged views of portion A and B, respectively, of FIG. 3.

With reference to FIG. 1, a semiconductor wafer 1 according to an example embodiment may include a plurality of semiconductor light emitting devices 10 not separated into individual devices on a surface thereof, arranged in a matrix, e.g., rows and columns. In an example embodiment, a first solder pad 610 and a second solder pad 620 to mount the semiconductor light emitting device 10 may be on each of the plurality of semiconductor light emitting devices 10.

Each of the plurality of semiconductor light emitting devices 10 may have a device separation region S where the semiconductor light emitting device 10 are to be separated from the semiconductor wafer 1 into individual devices. An align key AK region used to separate the plurality of semiconductor light emitting devices 10 into individual devices may be disposed in the device separation region S. A cutting point BL indicates where the semiconductor wafer 1 is to be cut to separate the plurality of semiconductor light emitting devices 10 into individual devices. The cutting point BL is within the device separation region S, e.g., the device separation region S may be wider along a direction orthogonal to the extending length of the cutting point BL. In particular, the device separation region S may be wider along a first direction D1 than the cutting point BL when the cutting point BL extends along a second direction D2 and the device separation region S may be wider along the second direction D1 than the cutting point BL when the cutting point BL extends along the first direction D2.

FIGS. 2 to 4B illustrate an individual semiconductor light emitting device 10 formed by cutting the semiconductor wafer 1 of FIG. 1. With reference to FIGS. 2 to 4B, the semiconductor light emitting device 10 will be described in detail. The semiconductor light emitting device 10 according to an example embodiment may include a light emitting structure 100, a first contact electrode 140, a second contact electrode 150, an insulating layer 300, and an electrode pad 400. The electrode pad 400 may include at least one pair of electrode pads including a first electrode pad 410 and a second electrode pad 420. The semiconductor light emitting device 10 of an example embodiment may be provided as a package, e.g., as a chip scale package (CSP) or a wafer level package (WLP).

The light emitting structure 100 may have a structure in which a plurality of semiconductor layers is stacked on a substrate 101 along a third direction D3. In particular, the light emitting structure 100 may include a first conductivity-type semiconductor layer 110, an active layer 120, and a second conductivity-type semiconductor layer 130, sequentially stacked on the substrate 101 along the third direction D3.

The substrate 101 may have a first surface 102, a second surface 103 opposed thereto, and a side surface 104 connecting the first surface 102 to the second surface 103. The substrate 101 may be provided as a semiconductor growth substrate, and an insulating material, a conductive material, or a semiconductor material, such as sapphire, silicon (Si), silicon carbide (SiC), magnesium aluminate (MgAl$_2$O$_4$), magnesium oxide (MgO), lithium aluminate (LiAlO$_2$), lithium gallate (LiGaO$_2$), gallium nitride (GaN), and aluminum nitride (AlN), may be used. Sapphire, widely used as a substrate for nitride semiconductor growth, may have electrical insulating properties. Sapphire is a crystal having Hexa-Rhombo R3c symmetry, has lattice constants of 13.001 Å and 4.758 Å in c-axis and a-axis directions, respectively, and includes a C (0001) plane, an A (11–20) plane, an R (1–102) plane, and the like. In this case, since a nitride thin film may be relatively easily grown on the C plane, which is stable at relatively high temperatures, the C plane is commonly used for a nitride growth substrate.

As illustrated in an example embodiment, a plurality of concave-convex structures U may be formed on the first surface 102 on which the semiconductor layer is grown. Due to the plurality of concave-convex structures U, crystallinity and light emitting efficiency of semiconductor layers may be improved. In an example embodiment, a concave-convex structure U described embodiments are not limited thereto. For example, the concave-convex structure U may be formed to have various shapes, such as a rectangle, a triangle, or the like, that improve light emitting efficiency and/or crystallinity. In addition, the concave-convex structure U may be selectively formed and provided and may be omitted depending on an example embodiment.

In addition, according to an example embodiment, a buffer layer may be grown on the first surface 102 of the substrate 101 before the first conductivity-type semiconductor layer 110 is grown. A buffer layer may reduce a lattice defect of the semiconductor layer grown on the substrate 101 and may be formed using an undoped semiconductor layer including a nitride, or the like. For example, the buffer layer may reduce a difference in a lattice constant between the substrate 101 including sapphire and the first conductivity-type semiconductor layer 110 including GaN stacked on an upper surface of the substrate 101, thereby improving crystallinity of a GaN layer. The buffer layer may be formed by growing undoped GaN, AlN, indium gallium nitride (InGaN), or the like, at a relatively low temperature between 500° C. to 600° C., to have a thickness of several tens to several hundreds of angstroms. Here, being undoped refers to a state in which a separate impurity doping process is not performed on a semiconductor layer. For example, in a case in which a gallium nitride semiconductor is grown using metal organic chemical vapor deposition (MOCVD), Si, used as a dopant, may be included at a level of about 1014 to 1018/cm$^3$, the same level of an impurity concentration as that of an impurity initially present in the semiconductor layer, although not intentional. However, the buffer layer is not an essential element in an example embodiment and may be omitted according to an example embodiment.

The first conductivity-type semiconductor layer 110 stacked on the substrate 101 may be formed using a semiconductor doped with an n-type impurity and may be provided as an n-type nitride semiconductor layer. In addition, the second conductivity-type semiconductor layer 130 may be formed using a semiconductor doped with a p-type impurity and may be provided as a p-type nitride semiconductor layer. However, the first conductivity-type semiconductor layer 110 and the second conductivity-type semiconductor layer 130 may be stacked in such a manner that positions thereof are changed inversely along the third direction D3, according to an example embodiment. The first conductivity-type semiconductor layer 110 and the second conductivity-type semiconductor layer 130 may have an empirical formula expressed as Al$_x$In$_y$Ga$_{(1-x-y)}$N (0≤x<1, 0≤y<1, 0≤x+y<1), such as GaN, AlGaN, InGaN, AlInGaN, or the like.

The active layer 120 between the first conductivity-type semiconductor layer 110 and the second conductivity-type semiconductor layer 130 may emit light having a predetermined level of energy through recombination of electrons and holes. The active layer 120 may include a material having an energy band gap smaller than that of the first conductivity-type semiconductor layer 110 and the second conductivity-type semiconductor layer 130. For example, in a case in which the first conductivity-type semiconductor layer 110 and the second conductivity-type semiconductor layer 130 are provided as a GaN-based compound semiconductor, the active layer 120 may include an InGaN-based compound semiconductor having an energy band gap smaller than that of GaN. In addition, the active layer 120 may have a multiple quantum well (MQW) structure in which a quantum well layer and a quantum barrier layer are alternately stacked, for example, an InGaN/GaN structure. However, since the active layer 120 is not limited thereto, a single quantum well structure (SQW) may be used as the active layer 120.

The light emitting structure 100 may include an etching region E in which portions of the second conductivity-type semiconductor layer 130, the active layer 120, and the first conductivity-type semiconductor layer 110 are etched and may include a plurality of mesa regions M partially segmented by the etching region E.

The etching region E may have a slit structure in which the semiconductor light emitting device 10 is cut to have a predetermined thickness and length in a direction from one side surface of the light emitting structure 100 having a rectangular shape toward the other side surface opposed thereto, when viewed from above, e.g., may extend along the first and second direction D1 and D2 to form a rectangle in plan view. In addition, a plurality of etching regions E may be arranged in parallel with each other in a rectangular region of the light emitting structure 100. Therefore, the plurality of etching regions E may be provided to have a structure surrounded by the plurality of mesa regions M.

For example, each semiconductor light emitting device 10 may include two mesa regions M, a first of which includes the light emitting structure 100 and a first electrode pad, and a second of which includes the second electrode pad 420. The two mesa regions M may be separated by an interior etching region E, which may include a first contact electrode 410 in contact with the electrode pad 400. A periphery of both mesa regions M may be surrounded by a peripheral etching region E when viewed in plan view.

Figure 4A:
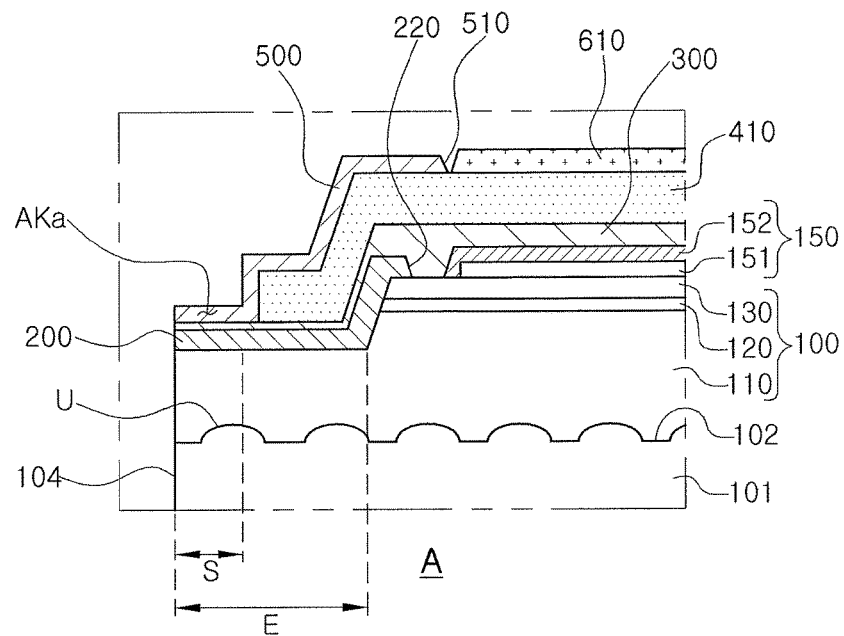
FIGS. 4A and 4B illustrate enlarged views of portions A and B of FIG. 3.
Figure 4B:
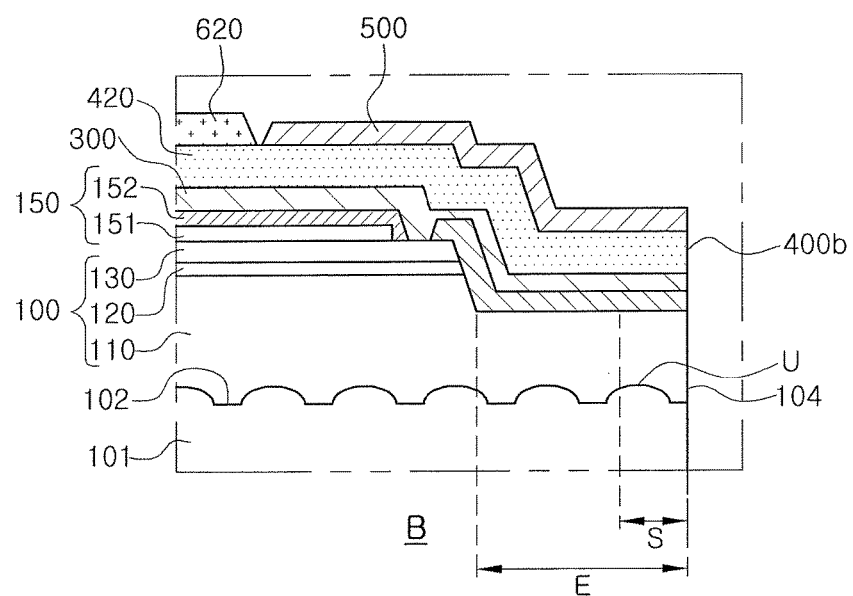

As illustrated in FIGS. 4A and 4B, a portion of the etching region E arranged in a region thereof in contact with a side surface 104 of the substrate 101 in the etching region E may be provided as a device separation region S used to separate the semiconductor light emitting device 10 into individual devices. The device separation region S may be provided as a region in which a crystal structure is deformed through irradiation by a laser to the substrate 101 in a process of separating the semiconductor light emitting device 10 into individual devices. As may be seen therein, the etching regions E are to be wider than the separation region S along a direction orthogonal to that which they extend.

With reference to FIG. 4A, the first electrode pad 410 may extend, e.g., along the second direction D2, into the peripheral etching region E adjacent thereto. However, the first electrode pad 410 does not extend along the second direction D1 into the key region Aka adjacent thereto.

With reference to FIG. 4B, the side surface 104 of the substrate 101 is provided as a cross-sectional view cut in a process in which the semiconductor light emitting device 10 is separated into individual devices. The side surface 104 of the semiconductor light emitting device 10 may be coplanar along the third direction D3 with a side surface 400b of the electrode pad 400 to be subsequently described. Therefore, the side surface 400b of the electrode pad 400 may be exposed to the side surface 104 of the semiconductor light emitting device 10.

As illustrated in FIG. 3, the first contact electrode 140 may be on an upper surface of the first conductivity-type semiconductor layer 110 exposed to the etching region E to be connected to the first conductivity-type semiconductor layer 110. The second contact electrode 150 may be on an upper surface of the plurality of mesa regions M to be connected to the second conductivity-type semiconductor layer 130. The first contact electrode 140 and the second contact electrode 150 may be on a same surface of the semiconductor light emitting device 10 as the light emitting structure 100. Therefore, the first contact electrode 140 and the second contact electrode 150 may be exposed on the same surface of the semiconductor light emitting device 10, e.g., an upper surface thereof, so that the first contact electrode 140 and the second contact electrode 150 may be mounted on a circuit board on which light emitting structure 100 is mounted, using a flip-chip method. The first contact electrode 140 and the second contact electrode 150 may include a material having a relatively high level of electrical conductivity, such as gold (Au), aluminum (Al), and silver (Ag) and may also have a multilayer structure.

As illustrated in FIG. 2, the first contact electrode 140 may include a plurality of pad portions 141 and a plurality of finger portions 142, each of which extend from the plurality of pad portions 141 along the second direction D2 and have a width along the first direction narrower than that of the plurality of pad portions 141. The first contact electrode may extend along the second direction D2 the interior etching region E. The first contact electrodes 140 may be arranged as a plurality of contact electrodes, e.g., three contact electrodes, at intervals in such a manner that a plurality of first contact electrodes 140 are uniformly distributed along the first direction D1 on the first conductivity-type semiconductor layer 110 as a whole. Thus, an electric current injected into the first conductivity-type semiconductor layer 110 through the plurality of first contact electrodes 140 may be uniformly injected into an entirety of the first conductivity-type semiconductor layer 110.

The plurality of pad portions 141 may be spaced apart from each other. Each of the plurality of finger portions 142 may connect the plurality of pad portions 141 along the second direction D2. The plurality of finger portions 142 may have widths along the first direction different from each other. For example, when the first contact electrode 140 includes three finger portions 142, as illustrated in an example embodiment, a width along the first direction D1 of one finger portion 142 may be greater than that of another finger portion 142. The width of one finger portion 142 may be adjusted in consideration of resistance of the electric current injected through the first contact electrode 140.

As illustrated in FIG. 3, the second contact electrode 150 may include a reflective metal layer 151. In addition, the second contact electrode 150 may further include a metal covering layer 152 covering the reflective metal layer 151. However, the metal covering layer 152 may be selectively provided and may also be omitted, according to an example embodiment. The second contact electrode 150 may be provided to cover an upper surface of the second conductivity-type semiconductor layer 130 defined as an upper surface of the mesa region M.

A first insulating layer 200 formed using an insulating material may be provided on the semiconductor light emitting device 10 including a side surface of the mesa region M, in order to cover the active layer 120 exposed to the etching region E. For example, the first insulating layer 200 may be formed using an insulating material including a material, such as $SiO_2$, $SiO_xN_y$, $TiO_2$, $Al_2O_3$, $ZrO_2$, and the like. In addition, the first insulating layer 200 may be provided to have a form providing a first contact region 210 and a second contact region 220, exposing the first contact electrode 140 and the second contact electrode 150. However, the first insulating layer 200 may be selectively provided and may be omitted, according to an example embodiment.

The second insulating layer 300 may be provided on the etching region E and the mesa region M of the light emitting structure 100 to have a structure covering an entirety of the light emitting structure 100. As shown in FIG. 3, the second insulating layer 300 may cover the two mesa regions M and the interior etching region E, but not the peripheral etching regions E. The second insulating layer 300 may be formed using a material having insulating properties and may be formed using an inorganic or organic material. For example, the second insulating layer 300 may be formed using an epoxy-based insulating resin. In addition, the second insulating layer 300 may include a silicon oxide or a silicon nitride, for example, $SiO_2$, $SiO_xN_y$, $TiO_2$, $Al_2O_3$, $ZrO_2$, and the like.

The second insulating layer 300 may include a plurality of openings 310 and 320, corresponding to the first contact electrode 140 and the second contact electrode 150, respectively. The plurality of openings 310 and 320 may include a first opening 310 and a second opening 320, provided in positions corresponding to the first contact electrode 140 and the second contact electrode 150, respectively. The first opening 310 and the second opening 320 may partially expose the first contact electrode 140 and the second contact electrode 150, respectively.

In detail, the first opening 310 may be formed to expose only a pad portion 141 of the first contact electrode 140. Thus, the first opening 310 may be in a position corresponding to the position of the pad portion 141 on the first contact electrode 140.

According to an example embodiment, a concave-convex portion formed by surface treatment using plasma may be provided on a surface of the insulating layer 200. The concave-convex portion may increase an area of an interface in contact with the electrode pad 400 to be subsequently described, thereby improving adhesive force of the electrode pad 400. In addition, as the adhesive force of the electrode pad 400 is improved, a separate adhesive layer is not required when the electrode pad 400 is deposited. Thus, a problem in which light is absorbed into an adhesive layer may be fundamentally fixed. Therefore, external light extraction efficiency of the semiconductor light emitting device may be improved.

The electrode pad 400 may be provided on the second insulating layer 300 and may be electrically connected to the first conductivity-type semiconductor layer 110 and the second conductivity-type semiconductor layer 130, respectively, through the plurality of openings 310 and 320.

As illustrated in FIG. 2, the electrode pad 400 may be electrically isolated from the first conductivity-type semiconductor layer 110 and the second conductivity-type semiconductor layer 130 by the second insulating layer 300 covering an entirety of an upper surface of the light emitting structure 100. In addition, the electrode pad 400 may be connected to the first contact electrode 140 and the second contact electrode 150, partially exposed through the first opening 310 and the second opening 320, thereby being electrically connected to the first conductivity-type semiconductor layer 110 and the second conductivity-type semiconductor layer 130.

Electrical connections between the electrode pad 400 and the first conductivity-type semiconductor layer 110 and the second conductivity-type semiconductor layer 130 may be variously adjusted by the first opening 310 and the second opening 320, provided in the second insulating layer 300. For example, the electrical connections between the electrode pad 400 and the first conductivity-type semiconductor layer 110 and the second conductivity-type semiconductor layer 130 may be variously changed according to the number and arrangement of the first opening 310 and the second opening 320.

The first electrode pad 410 may be electrically connected to the first conductivity-type semiconductor layer 110 through the first contact electrode 140. The second electrode pad 420 may be electrically connected to the second conductivity-type semiconductor layer 130 through the second contact electrode 150. In this case, the first opening 310 exposing the first contact electrode 140 is required to be disposed in a position overlapping the first electrode pad 410. The second opening 320 exposing the second contact electrode 150 is required to be disposed in a position overlapping the second electrode pad 420. In addition, the first electrode pad 410 and the second electrode pad 420 may be separated, e.g., along the first and second directions D1 and D2, to be electrically isolated from each other.

The electrode pad 400 may be formed using a material having a relatively high level of reflectivity. For example, the electrode pad 400 may be formed using a material, such as Au, Al, tungsten (W), platinum (Pt), Si, iridium (Ir), Ag, copper (Cu), nickel (Ni), titanium (Ti), and chromium (Cr) or a material including alloys thereof. The electrode pad 400 may also have a multilayer structure.

The electrode pad 400 of an example embodiment may improve external light extraction efficiency of light emitted from the active layer 120 in such a manner that respective sides 400a to 400d extended to be in contact with respective side surfaces 104 of the substrate 101, e.g., coplanar along the third direction D3. Since the electrode pad 400 has a relatively high level of reflectivity, the electrode pad 400 may reflect light emitted from the active layer 120, thereby improving external light extraction efficiency. Thus, when an area of the electrode pad 400 is relatively great, external light extraction efficiency may be improved.

However, when the electrode pad 400 is in the device separation region S, due to the relatively high level of reflectivity of the electrode pad 400, a region in which a laser is irradiated to a substrate for the semiconductor light emitting device 10 to be separated into individual devices may not be optically recognized. Thus, a problem in which the semiconductor light emitting device 10 may not be separated into individual semiconductor light emitting devices may occur. Due to such a problem, in the related art, the electrode pad 400 has not been disposed in the device separation region S.

In contrast, in accordance with an example embodiment, the electrode pad 400 may extend into the device separation region S, while an align key region from which the electrode pad 400 is removed may be disposed in a region thereof, e.g., at corners of the device separation region S. Thus, when the semiconductor wafer 1 is separated into individual devices 10, the region irradiating the laser to the substrate may be optically recognized through the align key region, e.g., regions Aka to Akd, which do not have the electrode pad 400 therein, as may be seen in FIG. 4A. Therefore, the area of the electrode pad 400 may extend into the device separation region S, thereby improving the external light extraction efficiency of the semiconductor light emitting device, while not extending into the align key region, thereby securing processability to individually separate the semiconductor light emitting device.

For example, an area of the device separation region S is about 7% to 9% of a total area of the semiconductor light emitting device 10. Thus, an area of the electrode pad 400 of an example embodiment may be expanded by about 7% to 9%, as compared with an electrode pad of a semiconductor light emitting device of the related art. This increased the external light extraction efficiency by 1% or more.

In an example embodiment, align key regions AKa to AKd are disposed on respective edges or corners of the semiconductor light emitting device 10 is described as an example, but the embodiments are not limited thereto. An arrangement of the align key regions AKa to AKd may be variously modified so that the laser irradiation region to separate the semiconductor light emitting device 10 into individual device units may be optically recognizable. In an example embodiment, the align key regions AKa to AKd have a '¬' shape, e.g., a chamfer, on an edge of the first electrode pad 410 is described as an example, but embodiments are not limited thereto. For example, each align key regions may be symmetrical along the first and second directions D1 and D2 at the edge. The align key regions AKa to AKd may be formed in an entirety of the first electrode pad 410 and the second electrode pad 420 or in either the first electrode pad 410 or the second electrode pad 420, according to arrangement of the first electrode pad 410 and the second electrode pad 420 of the semiconductor light emitting device 10. A plurality of align key regions AKa to AKd may all be formed to have substantially the same shape, but may have a difference in shape within a range allowable in a process.

Figure 5:
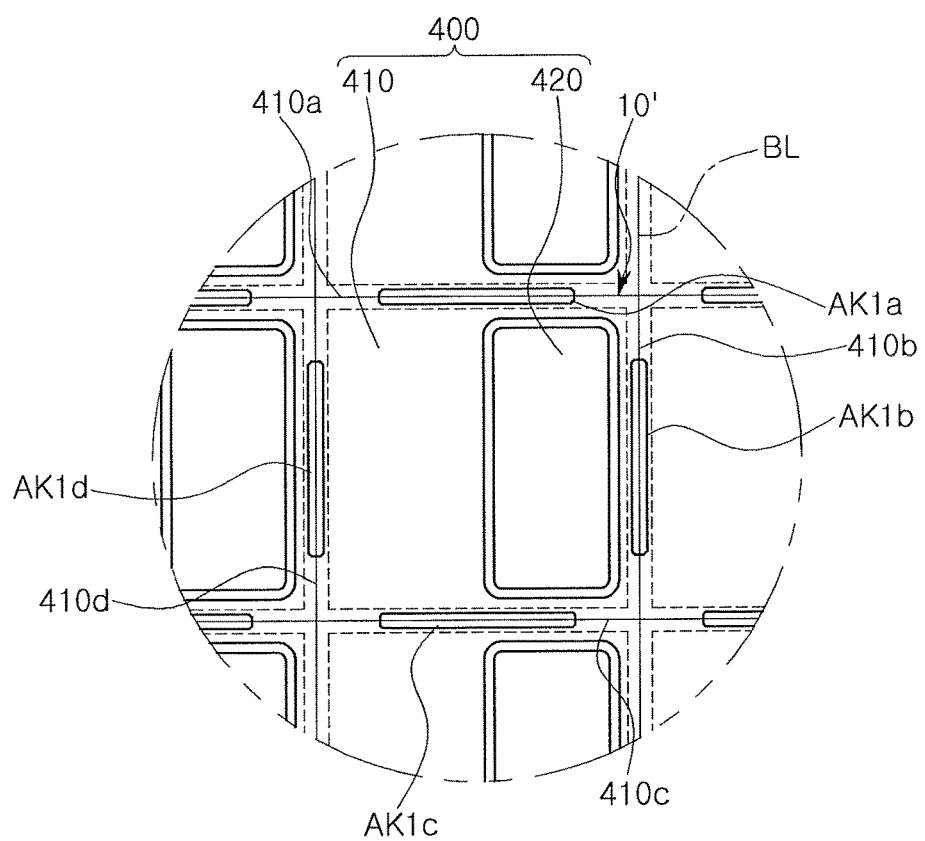
FIGS. 5 and 6 illustrate various modified examples of a first electrode pad and a second electrode pad of FIG. 2.
Figure 6:
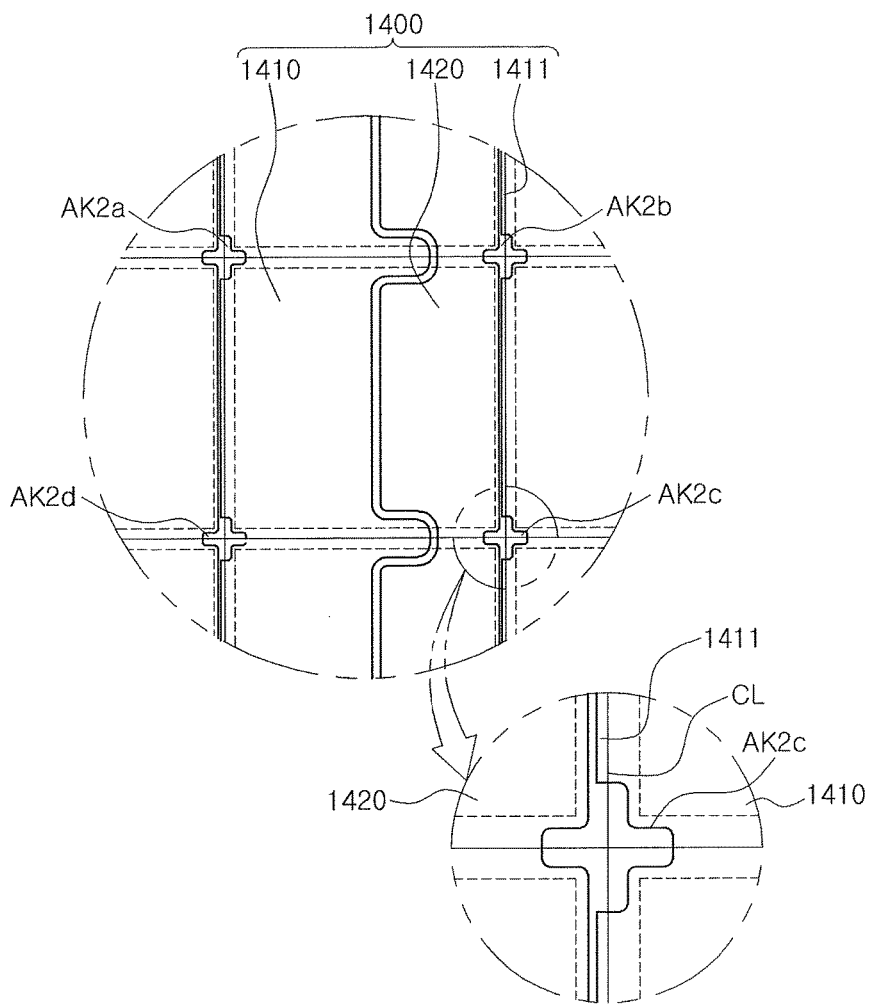

FIGS. 5 and 6 are modified examples of an align key region. For the sake of convenience of understanding, only an electrode pad is illustrated as being disposed on a semiconductor light emitting device.

FIG. 5 illustrates a case in which align key regions AK1a to AK1d are formed on respective sides 410a to 410d of an electrode pad 400 would to have a linear shape. Again, the electrode pad 400 would not extend into these align key regions AK1a to AK1d, but would otherwise extend into the separating regions indicated by the dashed lines.

In an example embodiment described above, a first electrode pad 410 is arranged to surround a perimeter of the second electrode pad 420. However, FIG. 6 illustrates an embodiment in which second electrode pads 1420 adjacent to each other are connected. A region 1411 of a first electrode pad 1410 may be disposed to oppose the second electrode pad 1420 of the semiconductor light emitting device, disposed adjacent thereto, across an align key region AK2c. Accordingly, when the semiconductor light emitting device is separated into individual device units, the region 1411 of the first electrode pad 1410 may be adjacent to the second electrode pad 1420, while being disposed in a device separation region to be isolated therefrom. Thus, the region 1411 may improve external light extraction efficiency of the semiconductor light emitting device. In addition, the second electrode pad 1420 may be spaced from the first electrode pads 1410 of the semiconductor light emitting device adjacent thereto by the align key region AK2c. Thus, a defect in the semiconductor light emitting device may be determined by applying power to the first electrode pad 1410 and the second electrode pad 1420 to be operated, before the semiconductor light emitting device is separated into individual device units.

Referring back to FIGS. 2 and 3, a passivation layer 500 may be provided on the electrode pad 400 and may cover and protect an entirety of the electrode pad 400. In addition, the passivation layer 500 may include bonding regions 510 and 520 partially exposing the electrode pad 400. The passivation layer 500 may be formed using the same material as a second insulating layer 300.

The bonding regions 510 and 520 may be provided as a plurality of bonding regions that partially expose the first electrode pad 410 and the second electrode pad 420, respectively. In this case, a portion of the plurality of bonding regions 510 and 520 may be arranged so as not to overlap a second opening 320 of the second insulating layer 300 along the third direction D3. For example, as illustrated in FIG. 3, the bonding region 520 partially exposing the second electrode pad 420 may not overlap the second opening 320 partially exposing the second contact electrode 150. In other words, a bonding region 520 may not be disposed above the second opening 320 in a vertical of third direction D3. The bonding region 510 partially exposing the first electrode pad 410 may partially or fully overlap a first opening 310 partially exposing the first contact electrode 140 along the third direction D3.

In an example embodiment, two bonding regions 510 and 520 are illustrated as being provided, but embodiments are not limited thereto. The number and arrangement of bonding regions 510 and 520 may be variously modified.

A solder pad 600 may be in each of the bonding regions 510 and 520. Thus, an area of the solder pad 600, e.g., in the first and second directions D1 and D2, may be smaller than that of the first electrode pad 410 and smaller than that of the second electrode pad 420. The solder pad 600 may include a first solder pad 610 and a second solder pad 620. The solder pad 600 may be connected to each of the first electrode pad 410 and the second electrode pad 420, partially exposed through the bonding regions 510 and 520. In this case, an area of each of the first solder pad 610 and the second solder pad 620 may be smaller than that of each of the first electrode pad 410 and the second electrode pad 420.

In addition, the first solder pad 610 and the second solder pad 620 may be electrically connected to the first conductivity-type semiconductor layer 110 and the second conductivity-type semiconductor layer 130, respectively, through the electrode pad 400. The solder pad 600 may be formed using a material including at least one of Ni, Au, Cu, and alloys thereof.

The first solder pad 610 and the second solder pad 620 may be provided as, for example, an under bump metallurgy (UBM) layer. In an example embodiment, each of the first solder pad 610 and the second solder pad 620 is illustrated as being provided as a single solder pad, but is not limited thereto. The number and arrangement of the first solder pad 610 and the second solder pad 620 may be adjusted, according to the number and arrangement of the bonding regions 510 and 520.

Subsequently, a process of manufacturing a semiconductor light emitting device of FIG. 2 will be described. FIGS. 7A to 14B are views of stages in a process of manufacturing a semiconductor light emitting device of FIG. 2 by main operations. In this case, FIGS. 7A to 13B are views of a wafer state before the semiconductor light emitting device is separated into individual devices, and BLa marks a cutting point in which the semiconductor light emitting device is separated into individual devices in a subsequent process. In FIGS. 7A to 14B, the same reference numerals as those in FIGS. 1 to 4 refer to the same members, and overlapping descriptions will be omitted.

Figure 7A:
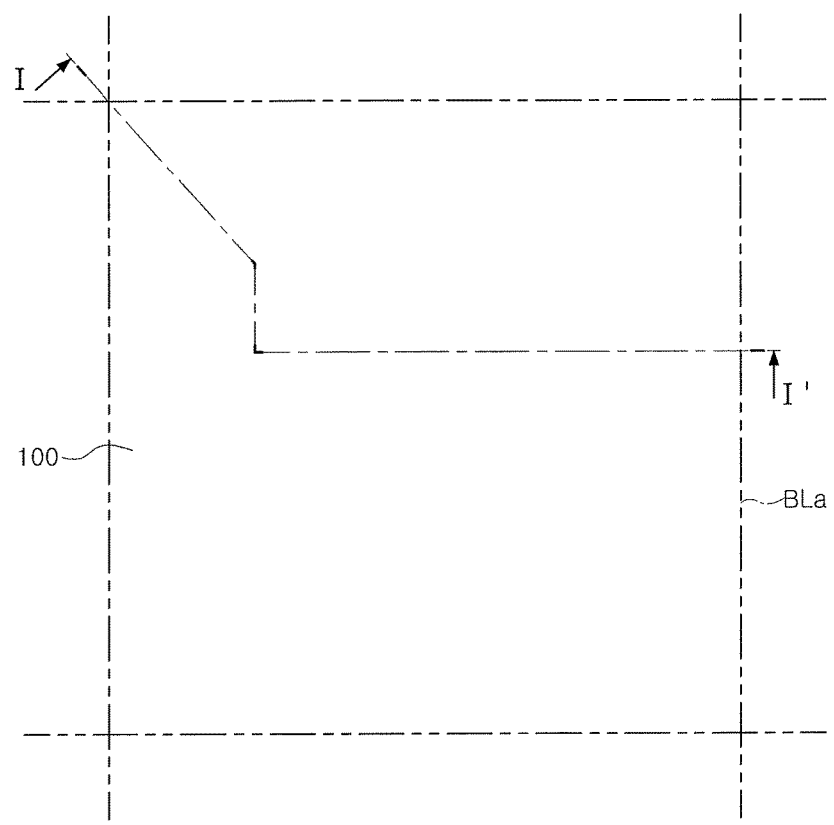
Figure 7B:
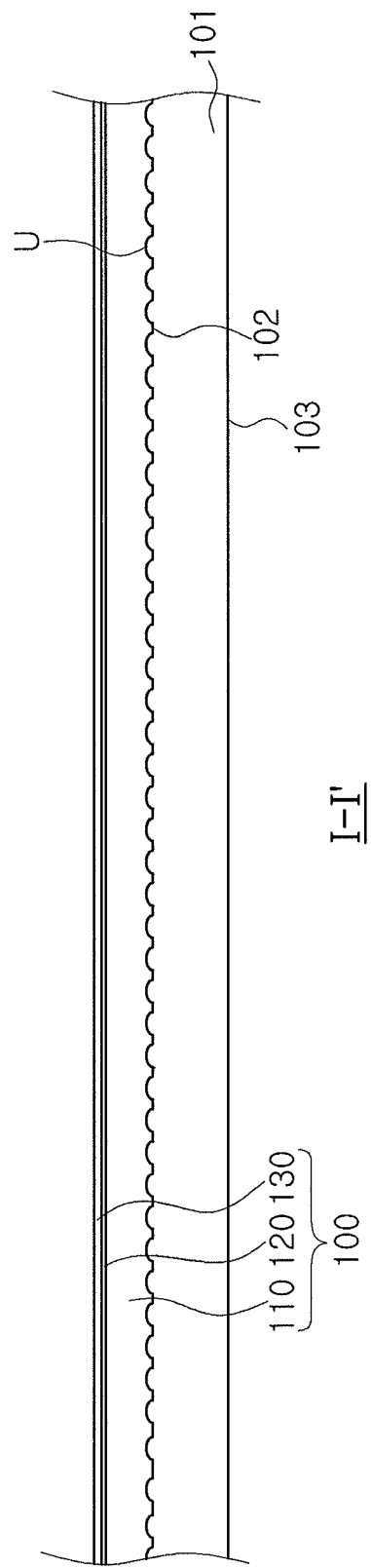

With reference to FIGS. 7A and 7B, FIG. 7A is a top view of a light emitting structure 100 formed on a substrate 101, while FIG. 7B illustrates a cross-sectional view taken along line I-I' of FIG. 7A. Hereinafter, FIGS. 8A to 14B will be illustrated using the same manner.

First, a concave-convex structure U may be formed on the substrate 101.

However, the concave-convex structure U may be omitted according to an example embodiment. As described above, a substrate formed using a material, such as sapphire, Si, SiC, $MgAl_2O_4$, MgO, $LiAlO_2$, $LiGaO_2$, and GaN, may be used as the substrate 101.

Subsequently, the light emitting structure 100 having a structure in which a plurality of semiconductor layers are stacked along the third direction D3 may be formed by sequentially growing a first conductivity-type semiconductor layer 110, an active layer 120, and a second conductivity-type semiconductor layer 130 on the substrate 101, using a process, e.g., metal organic chemical vapor deposition (MOCVD), hydride vapor phase epitaxy (HYPE), or molecular beam epitaxy (MBE). Here, the first conductivity-type semiconductor layer 110 and the second conductivity-type semiconductor layer 130 may be provided as an n-type semiconductor layer and a p-type semiconductor layer, respectively. Positions of the first conductivity-type semiconductor layer 110 and the second conductivity-type semiconductor layer 130 may be switched with each other in the light emitting structure 100. The second conductivity-type semiconductor layer 130 may first be formed on the substrate 101.

Figure 8A:
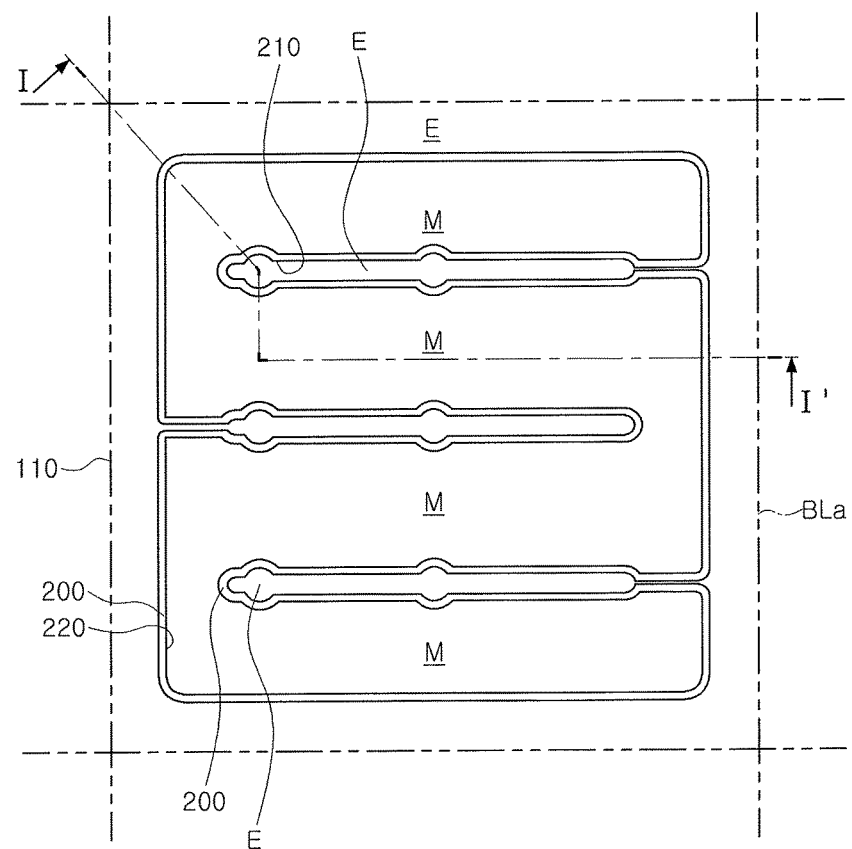

With reference to FIGS. 8A and 8B, portions of the second conductivity-type semiconductor layer 130, the active layer 120, and the first conductivity-type semiconductor layer 110 may be etched to expose at least a portion of the first conductivity-type semiconductor layer 110. Thus, a plurality of mesa regions M partially partitioned by the etching region E may be formed. In particular, the etching regions E may be exposed regions in which the first conductivity-type semiconductor layer 110 is exposed.

After a mask layer may be formed in a region not including a region in which the first conductivity-type semiconductor layer 110 is exposed, the mesa region M may be formed using a wet etching process or a dry etching process. According to an example embodiment, the etching process may be performed in such a manner that the first conductivity-type semiconductor layer 110 is not etched, but only a portion of an upper surface thereof is exposed.

A first insulating layer 200 covering the active layer 120 and providing a first contact region 210 and a second contact region 220 may be formed on a side surface of the mesa region M exposed to the etching region E by the etching process. The first insulating layer 200 may be formed to have a structure including portions of a perimeter of an upper surface of the mesa region M and a bottom surface of the etching region E to cover the side surface of the mesa region M. Thus, the active layer 120 exposed to the etching region E may be covered by the first insulating layer 200 so as not to be outwardly exposed. In other words, the second conductivity-type semiconductor layer 130 may be exposed by the first insulating layer 200 in the mesa regions M and the active layer 120 may be exposed by the first insulating layer 200 in the etching region E between the two Mesa regions M. However, the first insulating layer 200 may be selectively formed and may be omitted, according to an example embodiment.

Figure 9A:
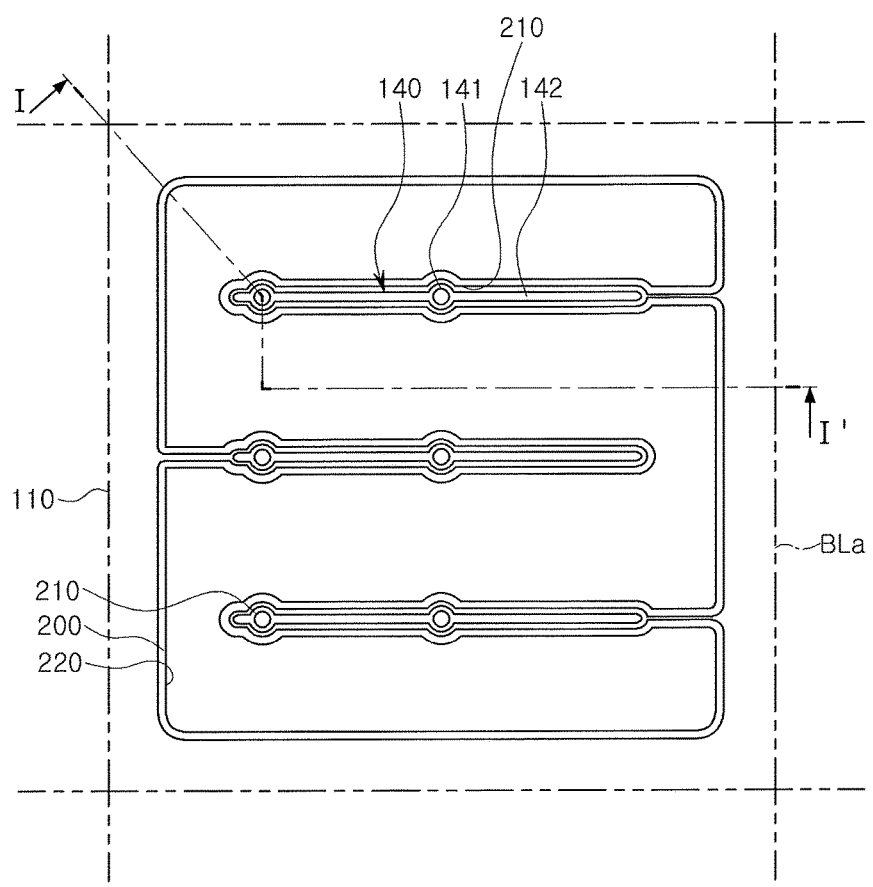

With reference to FIGS. 9A and 9B, the first contact electrode 140 and the second contact electrode 150 may be formed on the first contact region 210 and the second contact region 220, respectively. The first contact electrode 140 may be extended along the first contact region 210 and may be connected to the first conductivity-type semiconductor layer 110 defined as the bottom surface of the etching region E. In addition, the second contact electrode 150 may be connected to the second conductivity-type semiconductor layer 130.

The first contact electrode 140 may be formed to include a plurality of pad portions 141 and a plurality of finger portions 142 extended from the plurality of pad portions 141. The second contact electrode 150 may include a reflective metal layer 151. The second contact electrode 150 may further include a metal covering layer 152 covering the reflective metal layer 151. As such, when the first contact electrode 140 and the second contact electrode 150 are formed, a semiconductor light emitting device 10 may be provided.

Figure 10A:
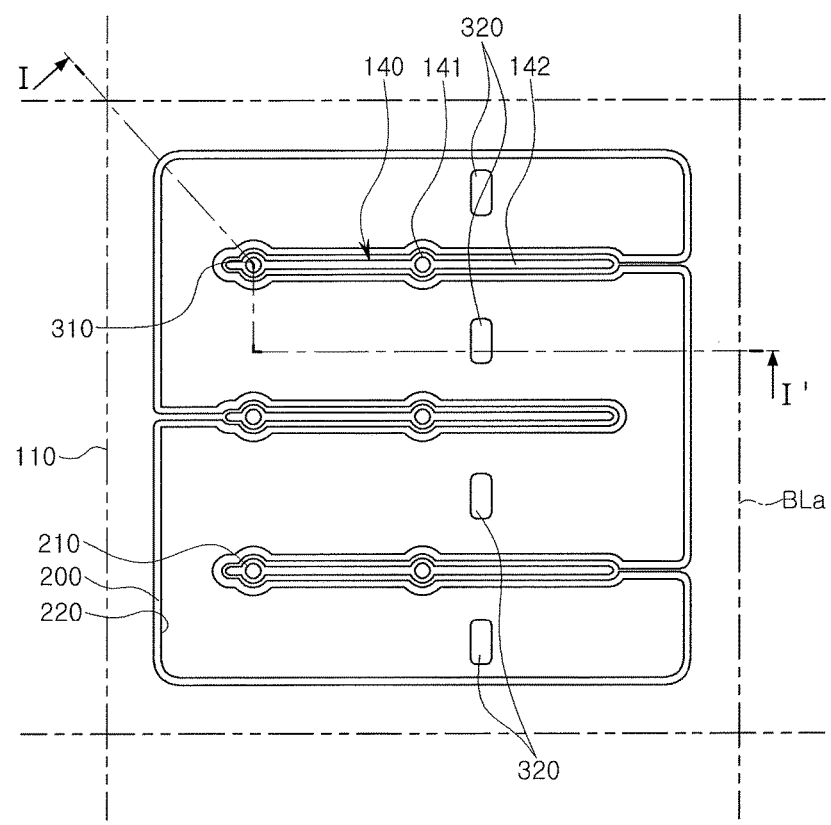
Figure 10B:
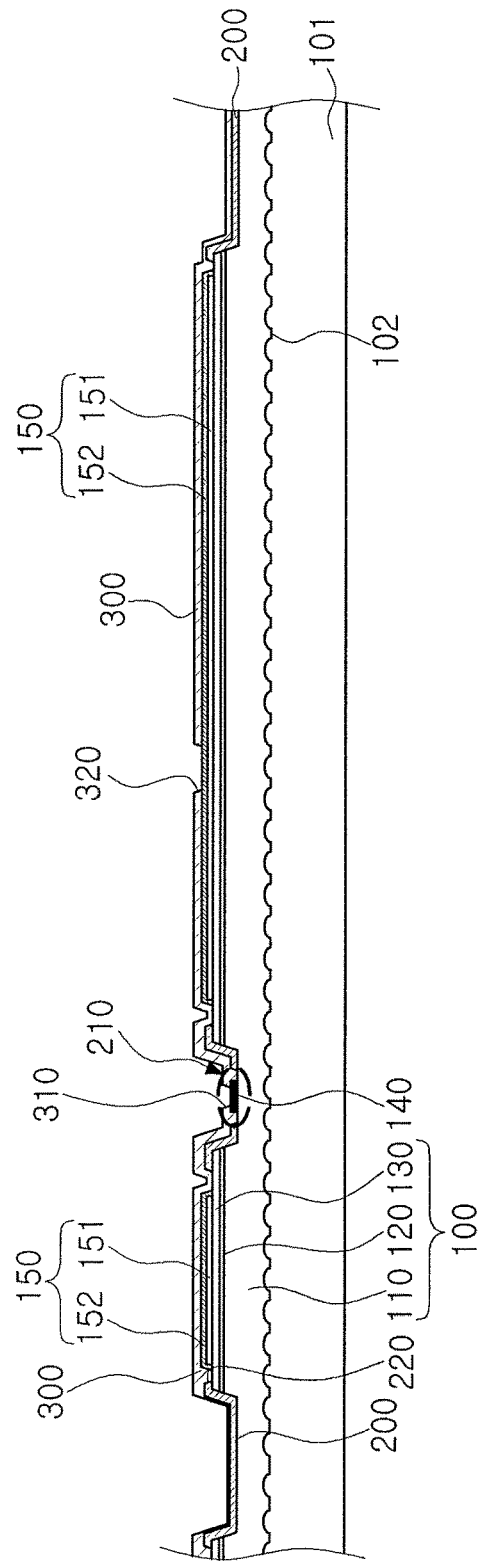

With reference to FIGS. 10A and 10B, a second insulating layer 300 may be formed to have a structure covering a surface of the light emitting structure 100. For example, the second insulating layer 300 may be formed using an epoxy-based insulating resin. In addition, the second insulating layer 300 may include a silicon oxide or a silicon nitride, for example, $SiO_2$, $SiO_xN_y$, $TiO_2$, $Al_2O_3$, $ZrO_2$, or the like.

In addition, the first contact electrode 140 and the second contact electrode 150 may be partially exposed on the first conductivity-type semiconductor layer 110 and the second conductivity-type semiconductor layer 130 through the first opening 310 and the second opening 320 in the second insulating layer 300. A plurality of openings 310 and 320 may be formed using a dry etching process, e.g., inductively coupled plasma reactive ion etching (ICP-RIE).

Figure 11A:
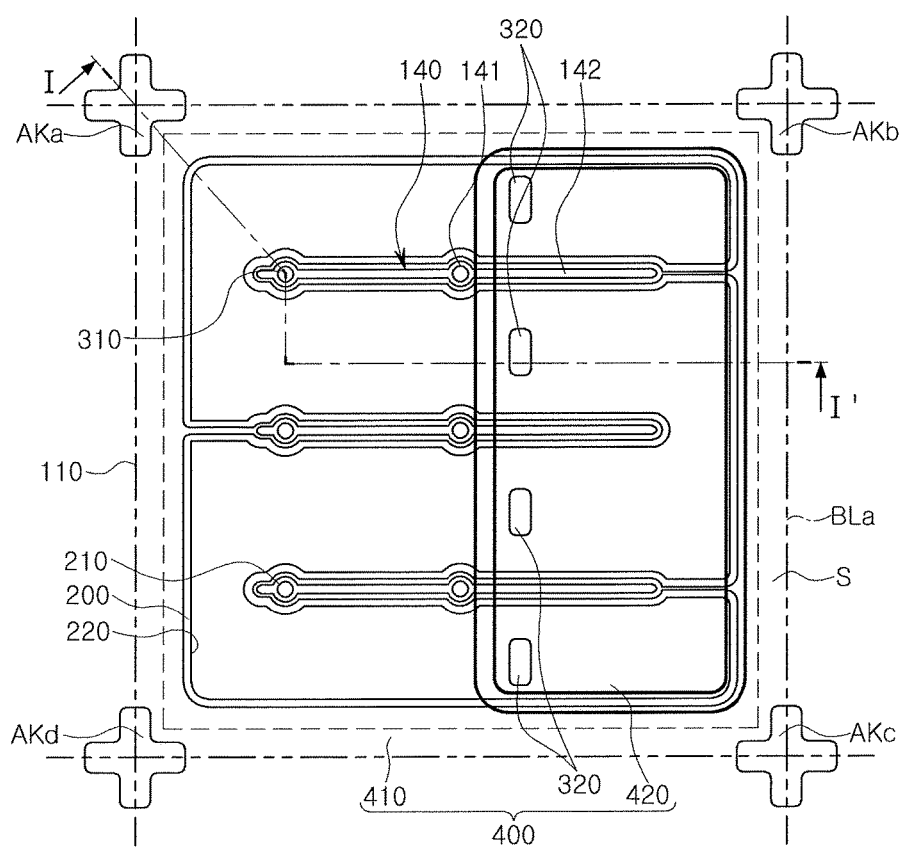
Figure 11B:
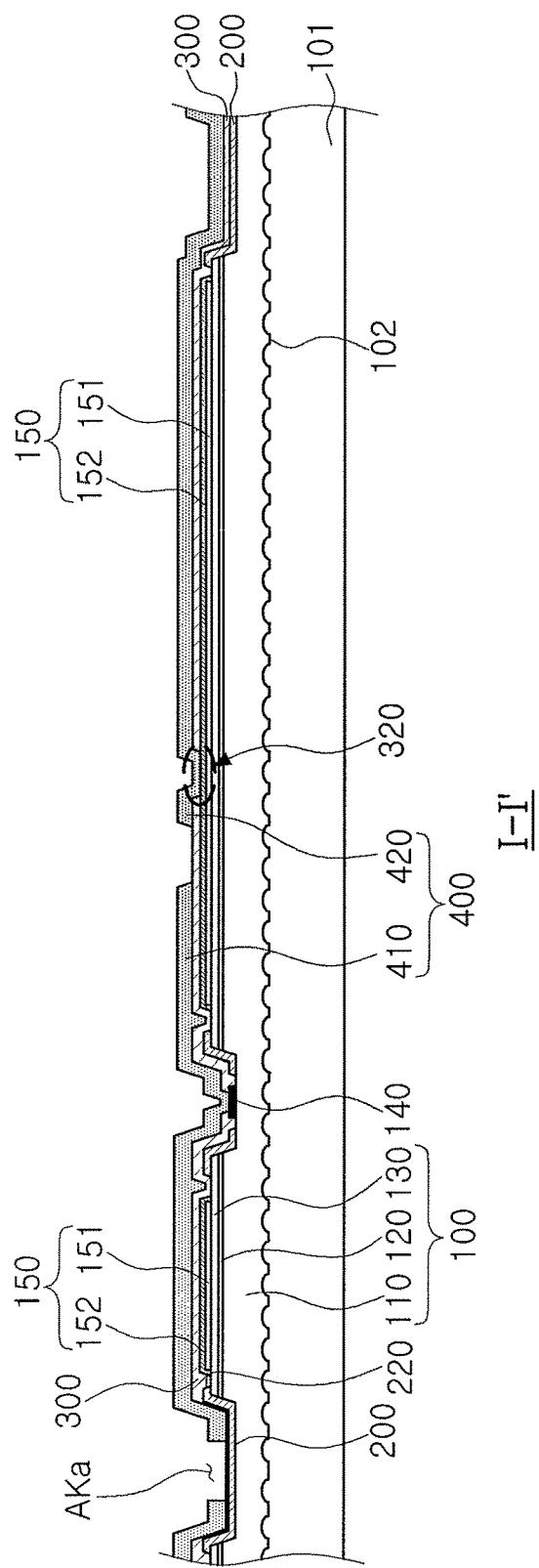

With reference to FIGS. 11A and 11B, an electrode pad 400 may be formed on the second insulating layer 300. The electrode pad 400 may include a first electrode pad 410 and a second electrode pad 420. The first electrode pad 410 and the second electrode pad 420 may be respectively connected to the first contact electrode 140 and the second contact electrode 150, exposed through the first opening 310 and the second opening 320 to be electrically connected to the first conductivity-type semiconductor layer 110 and the second conductivity-type semiconductor layer 130. The electrode pad 400 may be provided as at least one pair of electrode pads so that the first conductivity-type semiconductor layer 110 may be electrically isolated from the second conductivity-type semiconductor layer 130. In other words, the first electrode pad 410 may be electrically connected to the first conductivity-type semiconductor layer 110 through the first contact electrode 140. The second electrode pad 420 may be electrically connected to the second conductivity-type semiconductor layer 130 through the second contact electrode 150. The first electrode pad 410 and the second electrode pad 420 may be separated to be electrically isolated from each other, e.g., may be spaced apart along the second direction D2.

The electrode pad 400 may be formed to cover an entirety of a surface of the second insulating layer 300 other than the space between the first electrode pad 410 and the second electrode pad 420. In particular, the electrode pad 400 The first electrode pad 410 may be formed to surround a perimeter of the second electrode pad 420 and may be formed to be integrated with a first electrode pad of the semiconductor light emitting device, disposed adjacent thereto. Thus, the second electrode pad 410 may be commonly connected to the first conductivity-type semiconductor layer 110 of each of a plurality of light emitting structures 100.

Align key regions AKa to AKd from which a portion of the first electrode pad 410 is removed may be formed in a region in which straight lines BLa marking a cutting point of the first electrode pad 410 in a subsequent process meet, e.g., at corners thereof, such that the align key regions Aka to AKd do not include the electrode pad 400 therein. The align key regions AKa to AKd may be disposed in a device separation region S to separate a plurality of semiconductor light emitting devices into individual devices and may be arranged on a perimeter of each semiconductor light emitting device in a matrix pattern. A width of the align key regions AKa to AKd may be formed to be greater than that of a laser irradiation region to be subsequently described. However, a shape and arrangement of an align key region may be variously modified, according to the arrangement of the semiconductor light emitting device.

Figure 12A:
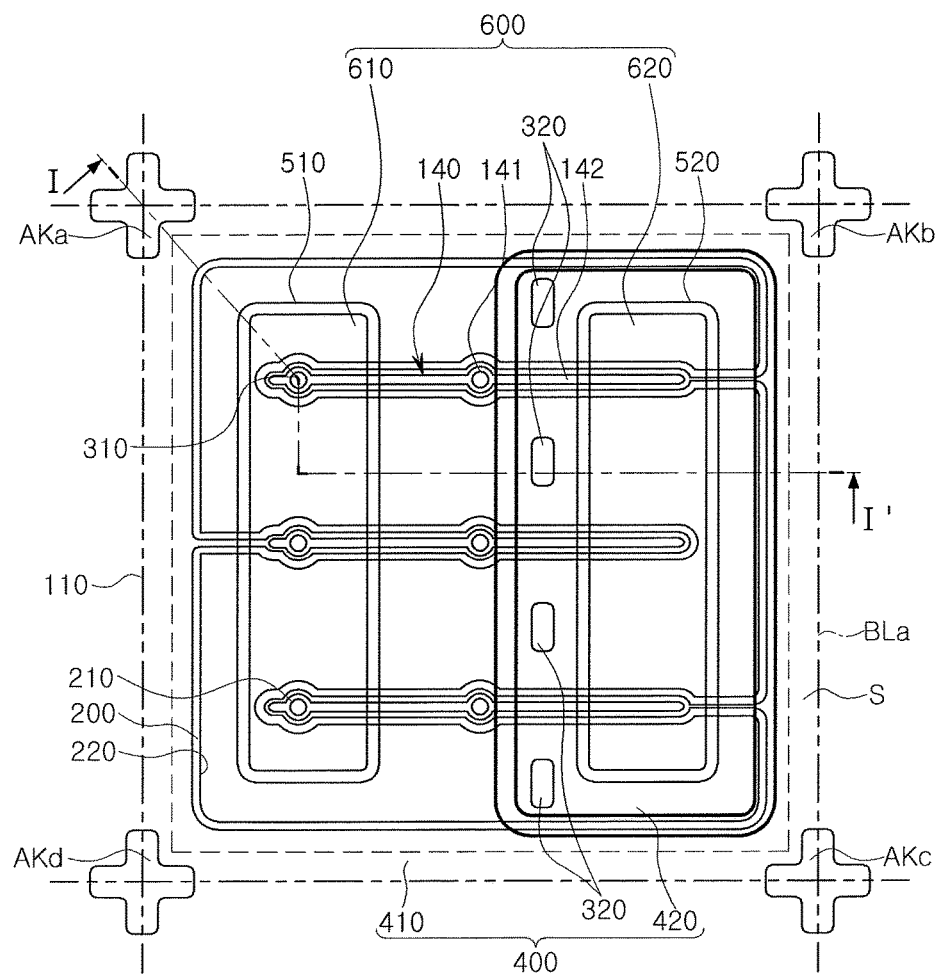
Figure 12B:
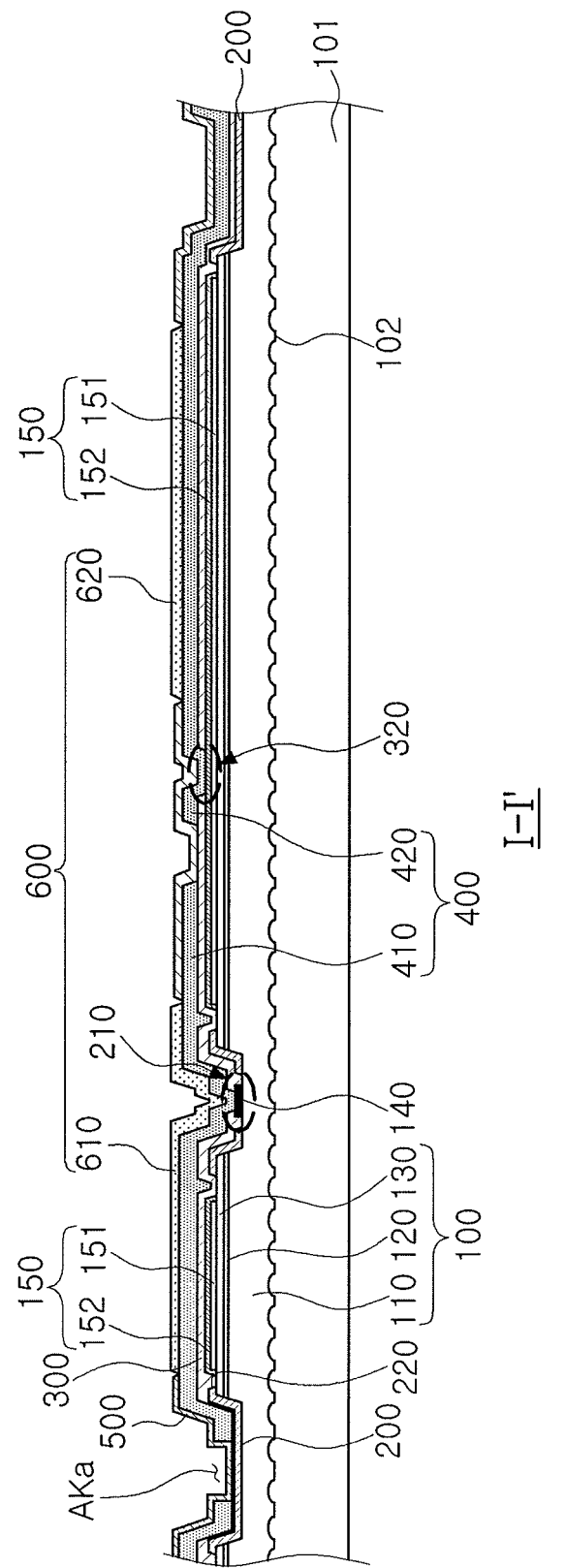

With reference to FIGS. 12A and 12B, a passivation layer 500 may be formed on the electrode pad 400. In addition, the passivation layer 500 may partially expose the electrode pad 400 through bonding regions 510 and 520. As may be seen therein, the passivation layer may cover, e.g., completely cover, a sidewall of the electrode pad 400 adjacent the key region AKa.

The bonding regions 510 and 520 may be provided as a plurality of bonding regions to partially expose the first electrode pad 410 and the second electrode pad 420, respectively. The passivation layer 500 may be formed using the same material as the second insulating layer 300.

A solder pad 600 including a first solder pad 610 and a second solder pad 620 may be formed on the first electrode pad 410 and the second electrode pad 420, respectively, partially exposed through the bonding regions 510 and 520. The first solder pad 610 and the second solder pad 620 may be, for example, a UBM layer. The number and arrangement structure of the first solder pad 610 and the second solder pad 620 are not limited to an example embodiment and may be variously changed, as described above.

Figure 13A:
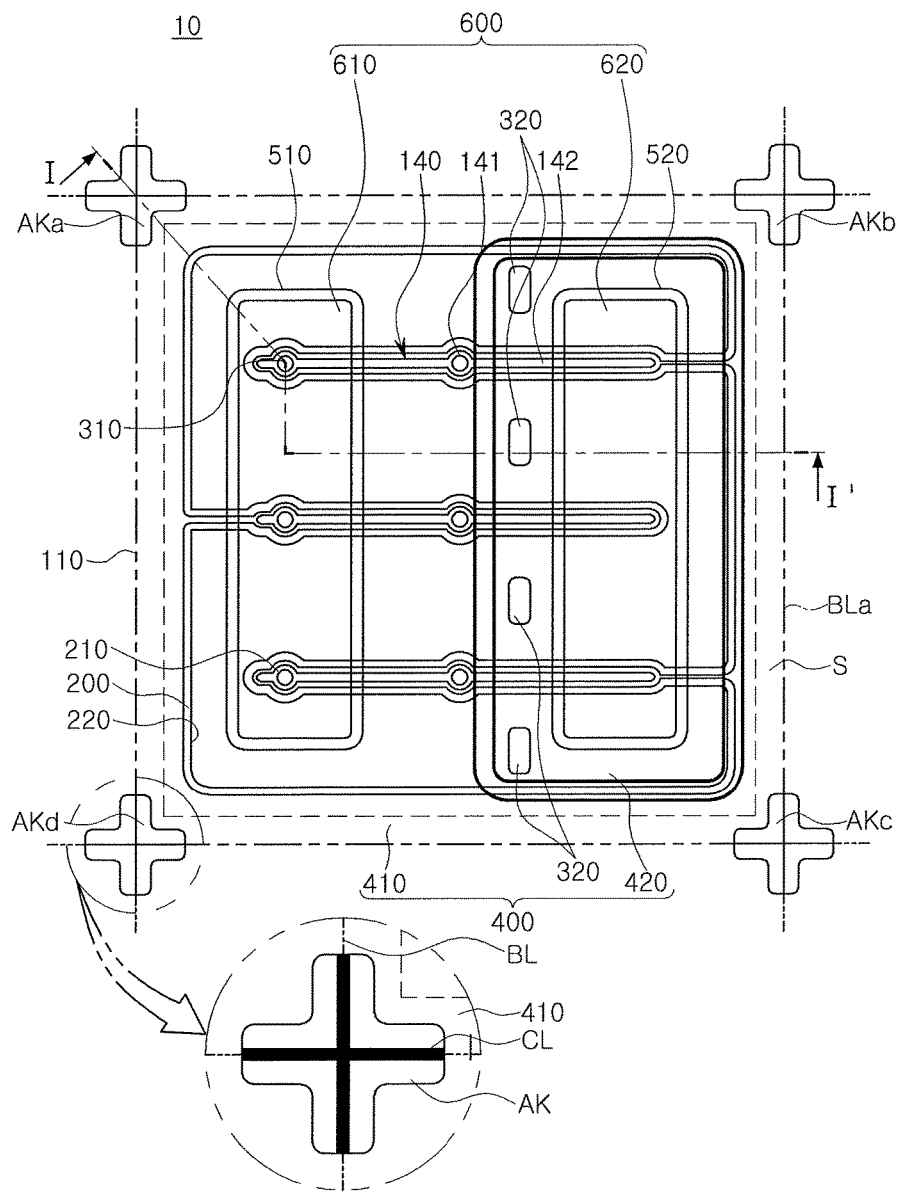
Figure 13B:
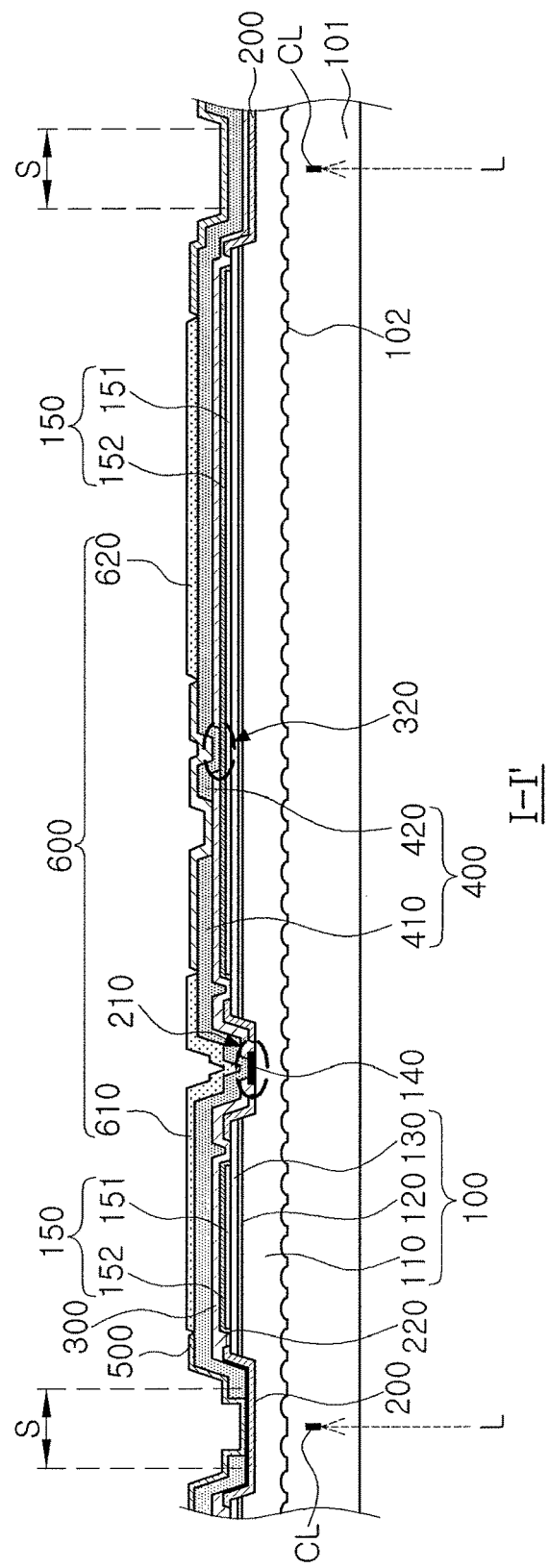

With reference to FIGS. 13A and 13B, a laser L is irradiated to an interior of the substrate 101 in a direction of a second surface 103 of the substrate 101, thereby forming a laser irradiation region CL in the device separation region S. The laser irradiation region CL is a portion in which a laser is irradiated to the substrate 101, and a crystal structure of the substrate 101 is deformed by thermal energy of the laser. The laser irradiation region CL may be formed to have a continuous straight line shape through irradiation by a continuous laser. The laser irradiation region CL may also be formed to have an intermittent dot shape by intermittently irradiating a laser thereto.

In this case, a laser having a relatively long wavelength may be used as the laser. For example, a stealth laser having a wavelength of 800 nm to 1200 nm may be used. The laser irradiation region CL may be formed in such a manner that the stealth laser is focused on the interior of the substrate 101 to be irradiated thereto. The laser irradiation region CL is provided as a region formed in such a manner that the substrate 101 is heated by a laser to be melted. The laser irradiation region CL is provided as a region in which a crystal structure thereof is deformed into an amorphous structure in a process in which a molten portion thereof is cooled. Since the amorphous structure is easily damaged by impacts, the laser irradiation region CL may be used as a starting point to separate the plurality of semiconductor light emitting devices into individual semiconductor light emitting devices 10. Thus, when the laser irradiation region CL is formed in a region in which the plurality of semiconductor light emitting devices may be separated into individual semiconductor light emitting devices, a crack occurring when the laser irradiation region CL is broken is transferred to the light emitting structure 100 to cut the substrate 101 and the light emitting structure 100, thereby manufacturing individual semiconductor light emitting devices.

However, in order to apply an impact to the laser irradiation region CL in a subsequent process, a position of the laser irradiation region CL should be optically and accurately recognized from an upper portion of the semiconductor light emitting device. When the impact is not accurately applied to the laser irradiation region CL, a crack may be transferred in an unintended direction, thereby damaging a light emitting structure and causing a defect therein. For example, when the electrode pad 400 is disposed in the device separation region S, there may be a problem in which the laser irradiation region CL may not be recognized from the upper portion of the semiconductor light emitting device. In an example embodiment, the problem has been solved in such a manner that an align key region AK of the electrode pad 400 is formed, and the laser irradiation region CL of the substrate 101 projected therethrough is optically recognized. For example, as shown in FIG. 13B, the electrode pad 400 is not the device separation region S where align key region AKa is, such that the align key region may secure proper alignment for the laser irradiation region CL.

Figure 14A:
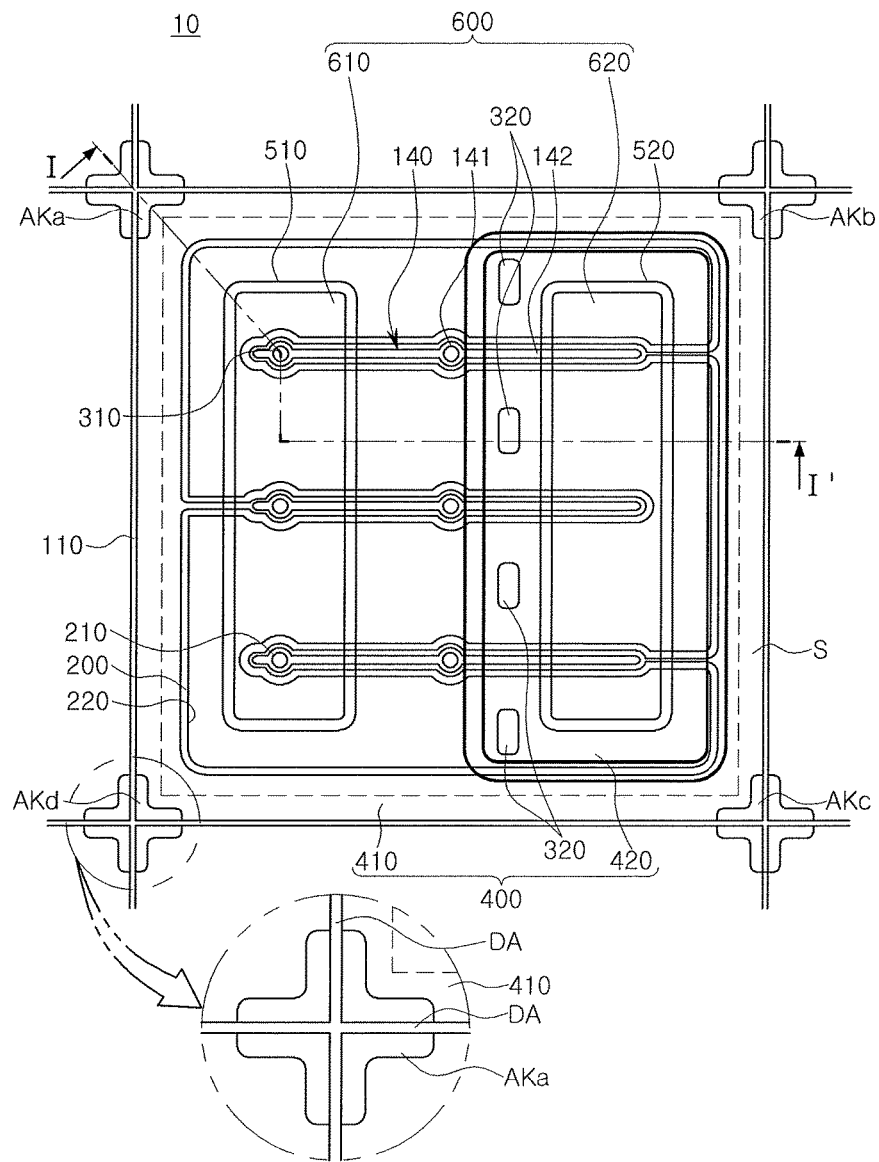
Figure 14B:
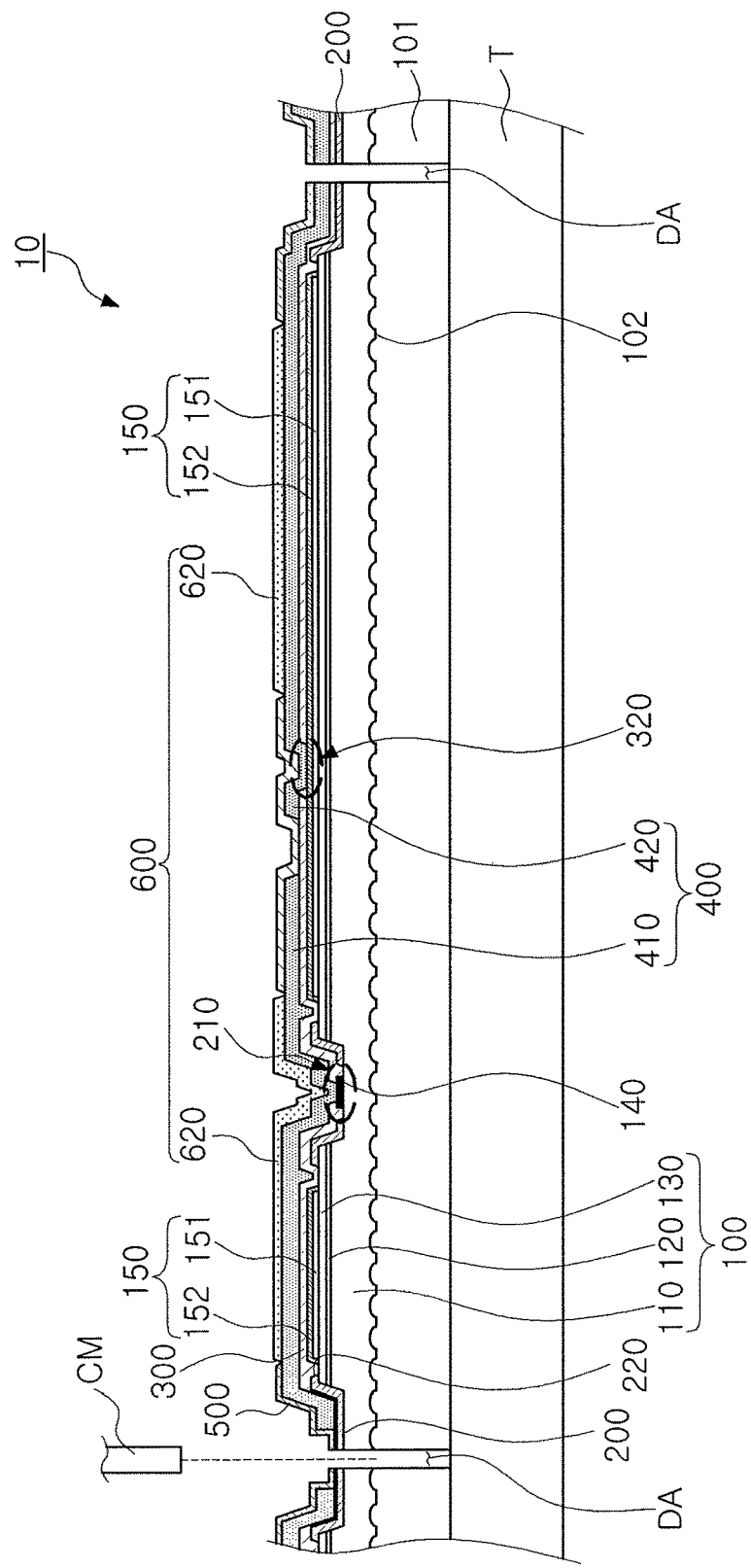

With reference to FIGS. 14A and 14B, a tape T may be attached to the substrate 101 to be temporarily fixed, and an impact may be applied to the laser irradiation region CL of FIG. 13A using an optical device CM or any other breaking mechanism, thereby cutting the semiconductor light emitting device 10 into individual device units. In FIG. 14A, the laser irradiation region CL may be broken by the impact, and a region DA from which, in actuality, a device is removed, is formed in the device separation region S, thereby separating the semiconductor light emitting device 10 from the semiconductor wafer 1 into individual semiconductor light emitting devices 10.

As set forth above, according to example embodiments, a semiconductor light emitting device having improved external light extraction efficiency, while maintaining yield, may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor light emitting device, comprising:
   a light emitting structure including a first conductivity-type semiconductor layer, an active layer and a second conductivity-type semiconductor layer, sequentially stacked along a first direction on a substrate, the light emitting structure including an exposed region in which the first conductivity-type semiconductor layer is exposed;
a first contact electrode in the exposed region;
a second contact electrode on the second conductivity-type semiconductor layer;
an insulating layer covering the light emitting structure;
a first electrode pad penetrating through the insulating layer to be electrically connected to the first contact electrode, at least a region of the first electrode pad being on the second contact electrode; and
a second electrode pad penetrating through the insulating layer to be electrically connected to the second contact electrode,
wherein at least one of a side surface of the first electrode pad and a side surface of the second electrode pad is extended to be coplanar with a side surface of the substrate along the first direction.

2. The semiconductor light emitting device as claimed in claim 1, wherein the first electrode pad has surfaces coplanar with respective side surfaces of the substrate along the first direction.

3. The semiconductor light emitting device as claimed in claim 1, wherein at least one of the first electrode pad and the second electrode pad has at least one align key region from which a portion of at least one of the first electrode pad and the second electrode pad overlapping the substrate along the first direction is removed.

4. The semiconductor light emitting device as claimed in claim 3, wherein an align key region in the at least one align key region, disposed on opposing side surfaces of the substrate, has a symmetrical shape.

5. The semiconductor light emitting device as claimed in claim 3, wherein the at least one align key region is in the exposed region.

6. The semiconductor light emitting device as claimed in claim 3, wherein the at least one align key region includes a first align key region, a second align key region, a third align key region, and a fourth align key region, in contact with respective side surfaces of the substrate, and the first align key region, the second align key region, the third align key region, and the fourth align key region have a same shape.

7. The semiconductor light emitting device as claimed in claim 3, wherein the at least one align key region includes a first align key region, a second align key region, a third align key region, and a fourth align key region, in contact with respective edges of the substrate, and the first align key region, the second align key region, the third align key region, and the fourth align key region have a same shape.

8. The semiconductor light emitting device as claimed in claim 3, wherein the at least one align key region does not overlap the light emitting structure along the first direction.

9. The semiconductor light emitting device as claimed in claim 1, wherein each of the first electrode pad and the second electrode pad has a multilayer structure.

10. The semiconductor light emitting device as claimed in claim 1, wherein at least one of the first electrode pad and the second electrode pad includes a plurality of spaced apart regions.

11. The semiconductor light emitting device as claimed in claim 1, further comprising a passivation layer covering the first electrode pad and the second electrode pad, as well as a first solder pad and a second solder pad, penetrating through the passivation layer to be electrically connected to the first electrode pad and the second electrode pad, respectively,
wherein an area of the first solder pad is smaller than an area of the first electrode pad and an area of the second solder pad is smaller than an area of the second electrode pad.

12. A semiconductor light emitting device, comprising:
a light emitting structure on a substrate and including a first conductivity-type semiconductor layer having an upper surface divided into a first region and a second region, an active layer, and a second conductivity-type semiconductor layer, sequentially stacked in a first direction on the second region of the first conductivity-type semiconductor layer;
a first contact electrode on the first region of the first conductivity-type semiconductor layer;
a second contact electrode on the second conductivity-type semiconductor layer;
an insulating layer covering the light emitting structure;
a first electrode pad penetrating through the insulating layer to be electrically connected to the first contact electrode, at least a portion of the first electrode pad being on the second contact electrode;
a second electrode pad penetrating through the insulating layer to be electrically connected to the second contact electrode;
a passivation layer covering the first electrode pad and the second electrode pad; and
a first solder pad and a second solder pad, penetrating through the passivation layer and electrically connected to the first electrode pad and the second electrode pad, respectively,
wherein at least one of the first electrode pad and the second electrode pad extends to a side of the substrate.

13. A semiconductor light emitting device, comprising:
a plurality of light emitting structures including a first conductivity-type semiconductor layer, an active layer, and a second conductivity-type semiconductor layer, sequentially stacked on a substrate along a first direction, and including an exposed region in which the first conductivity-type semiconductor layer is exposed;
at least one first electrode pad commonly connected to the first conductivity-type semiconductor layer of the plurality of light emitting structures; and
a plurality of second electrode pads connected to the second conductivity-type semiconductor layer of the plurality of light emitting structures, respectively,
wherein at least one of the at least one first electrode pad and the plurality of second electrode pads is on a device separation region separating the plurality of light emitting structures into individual semiconductor light emitting devices.

14. The semiconductor light emitting device as claimed in claim 13, wherein at least one of the at least one first electrode pad and the plurality of second electrode pads has an align key region on the device separation region.

15. The semiconductor light emitting device as claimed in claim 14, wherein the align key region is arranged in a region in which at least two light emitting structures among the plurality of light emitting structures oppose each other.

16. The semiconductor light emitting device as claimed in claim 14, wherein the align key region does not overlap the plurality of light emitting structures along the first direction.

17. The semiconductor light emitting device as claimed in claim 14, wherein the substrate includes a deformed region having a crystal structure deformed by irradiation in the device separation region that overlaps the align key region along the first direction.

18. The semiconductor light emitting device as claimed in claim 17, wherein a width of the align key region along a direction orthogonal to the first direction is greater than a width of the deformed region.

19. The semiconductor light emitting device as claimed in claim 13, wherein the at least one first electrode pad surrounds a perimeter of the plurality of second electrode pads.

20. The semiconductor light emitting device as claimed in claim 13, wherein the at least one first electrode pad is commonly connected to each of the plurality of light emitting structures.

* * * * *